(12) United States Patent  (10) Patent No.: US 9,090,974 B2
Yamaguchi et al.  (45) Date of Patent: Jul. 28, 2015

(54) ELECTRONIC DEVICE MANUFACTURING METHOD AND SPUTTERING METHOD

(75) Inventors: Nobuo Yamaguchi, Tama (JP); Kazuaki Matsuo, Inagi (JP)

(73) Assignee: Canon Anelva Corporation, Kawasaki-shi (JP)

( * ) Notice: Subject to any disclaimer, the term of this patent is extended or adjusted under 35 U.S.C. 154(b) by 351 days.

(21) Appl. No.: 13/596,734

(22) Filed: Aug. 28, 2012

(65) Prior Publication Data

US 2013/0048489 A1 Feb. 28, 2013

Related U.S. Application Data

(63) Continuation of application No. PCT/JP2010/002052, filed on Mar. 24, 2010.

(51) Int. Cl.
*C23C 14/34* (2006.01)
*C23C 14/50* (2006.01)
*H01J 37/34* (2006.01)

(52) U.S. Cl.
CPC ............. *C23C 14/50* (2013.01); *H01J 37/3441* (2013.01)

(58) Field of Classification Search
CPC ..... C23C 14/50; C23C 14/34; H01J 37/3447; H01J 37/3441
USPC .............. 204/192.12, 192.15, 192.17, 298.11
See application file for complete search history.

(56) References Cited

U.S. PATENT DOCUMENTS

| 6,551,471 B1 | 4/2003 | Yamaguchi et al. | |
|---|---|---|---|
| 8,129,663 B2 | 3/2012 | Masaki et al. | |
| 8,147,664 B2 | 4/2012 | Yamaguchi et al. | |
| 8,663,437 B2 * | 3/2014 | Yamaguchi et al. | ..... 204/298.11 |
| 2009/0166195 A1 | 7/2009 | Kobayashi et al. | |
| 2010/0000855 A1 | 1/2010 | Nakamura et al. | |
| 2010/0224482 A1 | 9/2010 | Yamaguchi et al. | |
| 2012/0152736 A1 | 6/2012 | Yamaguchi et al. | |

FOREIGN PATENT DOCUMENTS

CN 1303953 A 7/2001
CN 101469406 A 7/2009
(Continued)

OTHER PUBLICATIONS

International Search Report in International Application No. PCT/JP2010/002052, filed Mar. 24, 2012 (2 pages).

(Continued)

*Primary Examiner* — Rodney McDonald

(74) *Attorney, Agent, or Firm* — Fitzpatrick, Cella, Harper & Scinto

(57) ABSTRACT

An electronic device manufacturing method includes a first step of moving a substrate holder close to a first shield member and locating a first projecting portion formed on the first shield member and having a ring shape and a second projecting portion having a ring shape and formed on a second shield member installed on the surface of the substrate holder at the outer peripheral portion of a substrate at a position to engage with each other in a noncontact state, a second step of, after the first step, sputtering a target while maintaining the first projecting portion and the second projecting portion at the position to engage with each other in the noncontact state, and a third step of, after the second step, setting the first shield member in an open state and sputtering the target to perform deposition on the substrate.

8 Claims, 27 Drawing Sheets

(56) References Cited

FOREIGN PATENT DOCUMENTS

| | | |
|---|---|---|
| CN | 101615573 A | 12/2009 |
| JP | 6-299355 A | 10/1994 |
| JP | 6-338493 A | 12/1994 |
| JP | 8-78791 A | 3/1996 |
| JP | 8-269705 A | 10/1996 |
| JP | 10-140338 A | 5/1998 |
| JP | 10-183332 A | 7/1998 |
| JP | 10-204629 A | 8/1998 |
| JP | 2001-335927 A | 12/2001 |
| JP | 2002-302763 A | 10/2002 |
| JP | 3119563 U | 2/2006 |
| JP | 2009-127090 A | 6/2009 |
| WO | 2007/066511 A1 | 6/2007 |
| WO | WO2010/061603 * | 3/2010 |

OTHER PUBLICATIONS

Office Action issued in Chinese Patent Application No. 201080065679.2, dated Nov. 12, 2013 (19 pages).

* cited by examiner

F I G. 4A
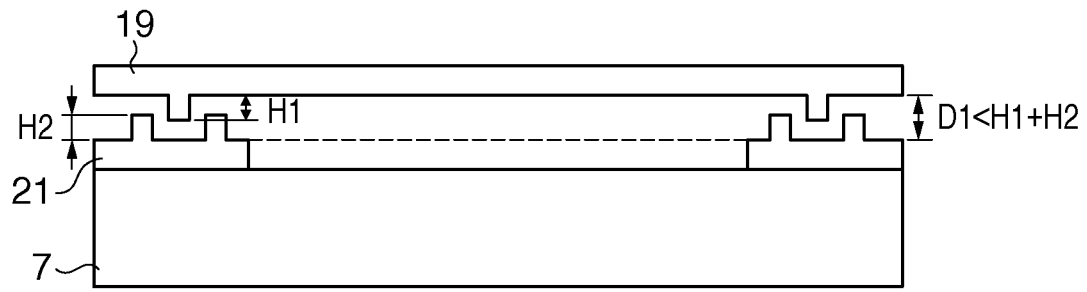
F I G. 4B
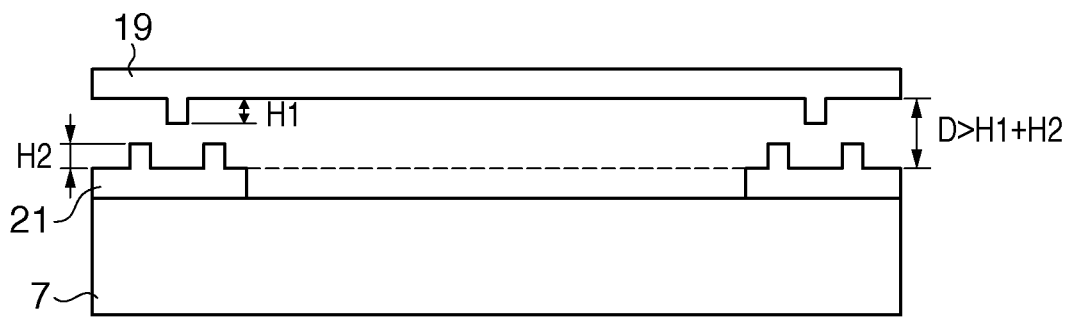
F I G. 4C
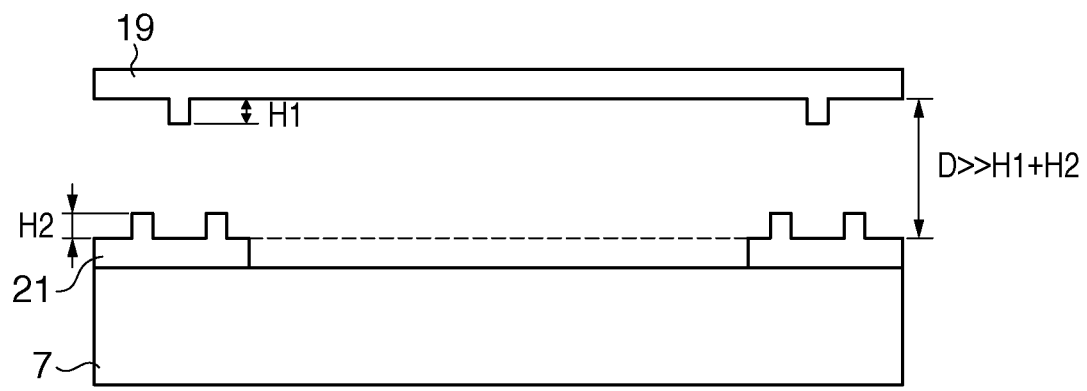

FIG. 11

| | GAS SPIKE | PLASMA IGNITION | PRE-SPUTTERING | CONDITIONING 1 | GAS SPIKE | PLASMA IGNITION | PRE-SPUTTERING | CONDITIONING 2 |
|---|---|---|---|---|---|---|---|---|
| STEP NUMBER (S) | 1101 | 1102 | 1103 | 1104 | 1105 | 1106 | 1107 | 1108 |
| SET TIME (SEC) | 0.1 | 2.0 | 5.0 | 240.0 | 5.0 | 2.0 | 5.0 | 180.0 |
| TARGET SHUTTER | CLOSED | CLOSED | CLOSED | OPEN | CLOSED | CLOSED | CLOSED | OPEN |
| SUBSTRATE SHUTTER | CLOSED | CLOSED | CLOSED | CLOSED | CLOSED | CLOSED | CLOSED | CLOSED |
| TARGET APPLICATION POWER (W) | 0 | 1000 | 1000 | 1000 | 0 | 750 | 750 | 750 |
| ARGON FLOW RATE (SCCM) | 400 | 400 | 100 | 100 | 200 | 200 | 10 | 10 |
| NITROGEN FLOW RATE (SCCM) | 0 | 0 | 0 | 0 | 10 | 10 | 10 | 10 |

FIG. 12

| | EXECUTION TIMING | DETERMINATION CONDITION |
|---|---|---|
| CONDITIONING START CONDITION 1 | EXECUTE AFTER LOT PROCESSING | TOTAL NUMBER OF PROCESSED SUBSTRATES IS USED AS SET VALUE — 1201 |
| CONDITIONING START CONDITION 2 | INTERRUPT LOT PROCESSING FOR EXECUTION | |
| CONDITIONING START CONDITION 3 | EXECUTE AFTER LOT PROCESSING | TOTAL NUMBER OF PROCESSED LOTS IS USED AS SET VALUE — 1202 |
| CONDITIONING START CONDITION 4 | INTERRUPT LOT PROCESSING FOR EXECUTION | |
| CONDITIONING START CONDITION 5 | EXECUTE AFTER LOT PROCESSING | TOTAL THICKNESS OF FILMS FORMED BY DEPOSITION APPARATUS IS USED AS SET VALUE — 1203 |
| CONDITIONING START CONDITION 6 | INTERRUPT LOT PROCESSING FOR EXECUTION | |
| CONDITIONING START CONDITION 7 | EXECUTE AFTER LOT PROCESSING | ACCUMULATED POWER TO TARGET IS USED AS SET VALUE — 1204 |
| CONDITIONING START CONDITION 8 | INTERRUPT LOT PROCESSING FOR EXECUTION | |
| CONDITIONING START CONDITION 9 | EXECUTE AFTER LOT PROCESSING | ACCUMULATED POWER PER SHIELD IS USED AS SET VALUE — 1205 |
| CONDITIONING START CONDITION 10 | INTERRUPT LOT PROCESSING FOR EXECUTION | |
| CONDITIONING START CONDITION 11 | EXECUTE AFTER LOT PROCESSING | STANDBY TIME IS USED AS SET VALUE — 1206 |
| CONDITIONING START CONDITION 12 | INTERRUPT LOT PROCESSING FOR EXECUTION | |
| CONDITIONING START CONDITION 13 | EXECUTE AFTER LOT PROCESSING | DEPOSITION CONDITION IS CHANGED — 1207 |

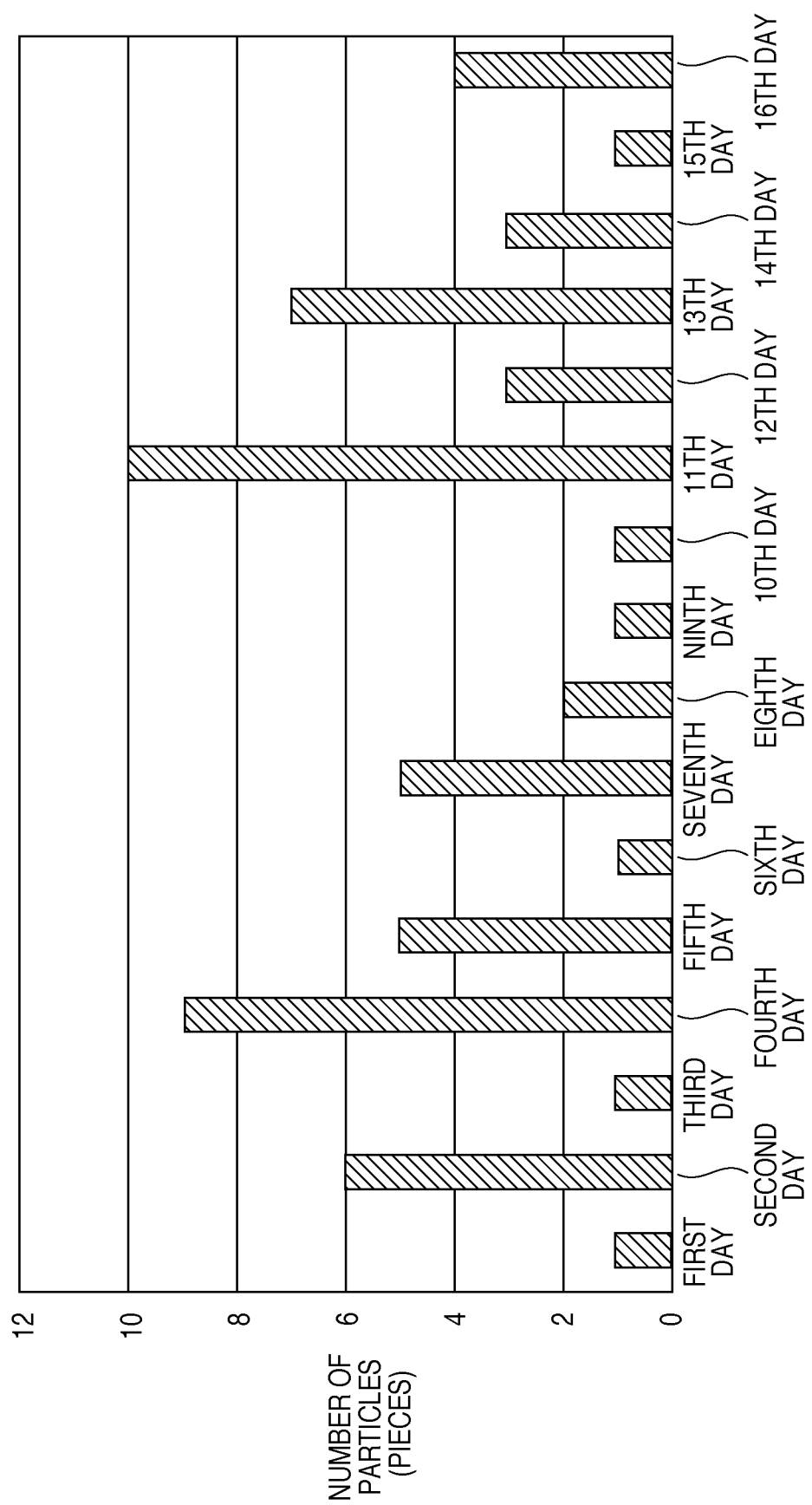

ELECTRONIC DEVICE MANUFACTURING METHOD AND SPUTTERING METHOD

TECHNICAL FIELD

The present invention relates to a method of manufacturing an electronic device such as a semiconductor device or a magnetic storage medium and a sputtering method.

BACKGROUND ART

A sputtering method of depositing a thin film on a substrate is a deposition method using an evacuated vacuum container. A target holder that holds a deposition source called a target made of a material to be deposited on a substrate and a substrate holder having a surface to place a substrate are installed in the vacuum container. An inert gas such as Ar or an inert gas such as nitrogen, or a process gas formed from a mixture of these gases is introduced into the vacuum container. A plasma is generated by applying a high voltage to the target, thereby adhering the target material to the substrate held by the substrate holder using the sputtering phenomenon of the target caused by charged particles in the discharged plasma.

When positive ions in the plasma enter the target material having a negative potential, the atoms or molecules of the target material are released from the target material. They are called sputtered particles. The sputtered particles adhere to the substrate and form a film containing the target material. In the sputtering apparatus, a shield plate capable of freely opening/closing, which is called a shutter, is normally provided between the target material and the substrate.

The shutter is mainly used for three purposes. The first purpose is to perform presputtering. In the normal sputtering apparatus, the plasma is generated not at the same time as the high voltage application but with a delay time of about 0.1 sec from the voltage application. Alternatively, no plasma may be generated even when the voltage is applied. Even if generated, the plasma may be unstable immediately after the start of discharge. Because of these phenomena, no film having a stable thickness and quality can be deposited. To avoid this problem, the shutter is used to execute so-called presputtering in which discharge is started while keeping the shutter closed, and the shutter is then opened after the discharge has stabilized so as to deposit the sputtered particles on the substrate.

The second purpose is to perform conditioning. Conditioning means discharge to be performed not to deposit sputtered particles on a substrate but to stabilize the characteristics of a deposited film.

For example, before the start of continuous deposition for production, discharge is performed under the same conditions as the continuous deposition conditions to stabilize the atmosphere in the vacuum container. Especially, in reactive sputtering for depositing an oxide or nitride of the target material by introducing a reactive gas such as nitrogen or oxygen or a gas mixture of a reactive gas and Ar, it is important for stable deposition to set the inner surface of the vacuum container to the same state as in continuous deposition. The reason for this is as follows. When a reactive gas is introduced into the vacuum container whose inner surface is covered with a film made of the target material, a bonding reaction occurs between the film and the reactive gas. For this reason, the atmosphere in the vacuum container does not stabilize, and no stable film characteristics can be obtained.

However, the sputtered particles adhere not only to the inner surface of the vacuum container but also to the substrate placing surface of the substrate holder. To prevent this, the shutter provided in the vicinity of the substrate holder is used. Discharge is performed by introducing an inert gas and a reactive gas into the vacuum container while preventing deposition on the substrate placing surface by closing the shutter to hide the substrate placing surface of the substrate holder viewed from the sputtering surface of the target but not to hide the inner surface of the vacuum container. A nitride or oxide thus adheres to the inner surface of the vacuum container. After the nitride or oxide is sufficiently adhered to the inner surface of the vacuum container in advance, deposition on the substrate starts. This allows the quality of the thin film deposited on the substrate to be stabilized.

In the conditioning, discharge may be performed under conditions different from the production conditions halfway through the continuous deposition for production. For example, when a high-stress film is continuously deposited on substrates by reactive sputtering, the film adhered to the inner surface of the vacuum container peels off due to the stress. The peeled film adheres to the substrate and degrades the characteristics of the electronic device. To prevent this, a low-stress metal film may periodically be deposited by nonreactive sputtering. For example, when a TiN film is continuously deposited, conditioning of Ti deposition is periodically performed. When only a TiN film is continuously deposited, the TiN film adhered to the anti-adhesion shield or the like in the vacuum container peels off. Periodically performing conditioning of Ti deposition allows to prevent this.

The third purpose is to perform target cleaning. Target cleaning is executed using the shutter when sputtering the contaminated or oxidized target surface in advance to remove the contaminated or oxidized portion of the target before continuous deposition before production. When manufacturing the target, the target is formed by machining using a lathe or the like in the final step. A contaminant generated from the grinding tool at this time adheres to the target surface. Alternatively, the target surface is oxidized during transportation of the target. It is necessary before deposition to sufficiently sputter the target surface to expose a clean target surface. In this case, sputtering is performed while keeping the shutter closed such that the contaminated or oxidized target particles do not adhere to the substrate placing surface of the substrate holder.

Against the backdrop of requirements for higher device performance, the target material that has adhered to the lower surface of a semiconductor substrate may diffuse into the semiconductor substrate upon annealing to degrade the device characteristics or may be brought in the subsequent step to contaminate the substrate processing apparatus from the next step. Contaminating another apparatus via the lower surface of the substrate has a large influence even if the target material adhesion amount to the lower surface of the substrate is very small, for example, about $1 \times 10^{11}$ atms/cm$^2$. For this reason, strict management is required.

The above-described problem arises because a gap is present around the shutter even when it is closed, and a very small amount of sputtered particles passes through the gap. That is, the sputtered particles adhere to the substrate placing surface of the substrate holder during conditioning or target cleaning. The sputtered particles adhere to the lower surface of the substrate to contaminate the substrate. In addition, the sputtered particles are transported to the next step to contaminate another manufacturing apparatus.

As a technique of avoiding the problem of sputtered particle wraparound at the time of target cleaning or presputtering, for example, PTL1 discloses a technique of installing a cylindrical cathode cover around a target and providing a shutter with a minimum gap with respect to an end of the opening of the cathode cover.

Each of PTL2 and PTL3 discloses an apparatus having two shutters between a substrate and a target or between a substrate and a deposition source.

CITATION LIST

Patent Literature

PTL1: Japanese Patent Laid-Open No. 8-269705
PTL2: Japanese Patent Laid-Open No. 2002-302763
PTL3: Japanese Patent Laid-Open No. 8-78791

SUMMARY OF INVENTION

Technical Problem

In the apparatus of PTL1, however, no detailed shape is disclosed concerning the gap between the shutter and the cathode cover opening portion. On the other hand, there has arisen a demand for eliminating film adhesion to the substrate placing surface at the atomic level as an electronic device achieves a higher performance, as described above. However, sputtered particle wraparound at the atomic level cannot be prevented by the structure with a gap provided between the shutter and the cathode cover opening surface.

In PTL2 and PTL3, deposition can start in a stable state, and particle generation can be suppressed. However, these techniques do not solve the problem of sputtered particles wraparound to the substrate placing surface of the substrate holder in a minute amount as required recently.

Solution to Problem

In consideration of the above-described problems of the related arts, the present invention provides an electronic device manufacturing method of, when performing discharge for conditioning and target cleaning in an apparatus for depositing a thin film on a substrate by sputtering at the time of manufacture of a semiconductor device, preventing sputtered particles from adhering to the substrate placing surface of a substrate holder to suppress contamination of the substrate or another manufacturing apparatus and also maintaining a stable film quality and suppressing particle generation.

An electronic device manufacturing method according to the present invention is an electronic device manufacturing method using a sputtering apparatus including:

a target holder provided in a vacuum container and configured to hold a target to be used for deposition on a substrate;

a substrate holder configured to hold the substrate;

a first shield member arranged near the substrate holder and configured to set one of a closed state in which the substrate holder is shielded from the target holder and an open state in which the substrate holder is opened to the target holder;

first opening/closing driving means for opening/closing-driving the first shield member to one of the open state and the closed state;

a second shield member having a ring shape and installed on a surface of the substrate holder at an outer peripheral portion of the substrate; and driving means for moving the substrate holder to move the substrate holder with the second shield member being installed close to or away from the first shield member in the closed state, the first shield member having at least one first projecting portion extending in a direction of the second shield member and having a ring shape, and the second shield member having at least one second projecting portion extending in a direction of the first shield member and having a ring shape, the method comprising:

a first step of causing the driving means to move the substrate holder close to the first shield member and locating the first projecting portion and the second projecting portion at a position to engage with each other in a noncontact state;

a second step of, after the first step, sputtering the target while maintaining the first projecting portion and the second projecting portion at the position to engage with each other in the noncontact state; and a third step of, after the second step, causing the first opening/closing driving means to set the first shield member in the open state and sputtering the target to perform deposition on the substrate.

Alternatively, an electronic device manufacturing method according to the present invention is an electronic device manufacturing method using a sputtering apparatus including:

a target holder provided in a vacuum container and configured to hold a target to be used for deposition on a substrate;

a substrate holder configured to hold the substrate;

a first shield member arranged near the substrate holder and configured to set one of a closed state in which the substrate holder is shielded from the target holder and an open state in which the substrate holder is opened to the target holder;

first opening/closing driving means for opening/closing-driving the first shield member to one of the open state and the closed state;

a second shield member having a ring shape and installed on a surface of the substrate holder at an outer peripheral portion of the substrate; and driving means for moving the first shield member to move the first shield member in the closed state close to or away from the substrate holder with the second shield member being installed, the first shield member having at least one first projecting portion extending in a direction of the second shield member and having a ring shape, and the second shield member having at least one second projecting portion extending in a direction of the first shield member and having a ring shape, the method comprising:

a first step of causing the driving means to locate the first shield member such that the first projecting portion and the second projecting portion engage with each other in a noncontact state;

a second step of, after the first step, sputtering the target while maintaining the first projecting portion and the second projecting portion at a position to engage with each other in the noncontact state; and a third step of, after the second step, causing the first opening/closing driving means to set the first shield member in the open state and sputtering the target to perform deposition on the substrate.

Alternatively, a sputtering method according to the present invention is a sputtering method using a sputtering apparatus including:

a target holder provided in a vacuum container and configured to hold a target to be used for deposition on a substrate;

a substrate holder configured to hold the substrate;

a first shield member arranged near the substrate holder and configured to set one of a closed state in which the substrate holder is shielded from the target holder and an open state in which the substrate holder is opened to the target holder;

first opening/closing driving means for opening/closing-driving the first shield member to one of the open state and the closed state;

a second shield member having a ring shape and installed on a surface of the substrate holder at an outer peripheral portion of the substrate; and driving means for moving the substrate holder to move the substrate holder with the second shield member being installed close to or away from the first shield member in the closed state, the first shield member having at least one first projecting portion extending in a direction of the second shield member and having a ring shape, and the second shield member having at least one second projecting portion extending in a direction of the first shield member and having a ring shape, the method comprising:

a first step of causing the driving means to move the substrate holder close to the first shield member and locating the first projecting portion and the second projecting portion at a position to engage with each other in a noncontact state; and a second step of, after the first step, sputtering the target while maintaining the first projecting portion and the second projecting portion at the position to engage with each other in the noncontact state.

Alternatively, a sputtering method according to the present invention is a sputtering method using a sputtering apparatus including:

a target holder provided in a vacuum container and configured to hold a target to be used for deposition on a substrate;

a substrate holder configured to hold the substrate;

a first shield member arranged near the substrate holder and configured to set one of a closed state in which the substrate holder is shielded from the target holder and an open state in which the substrate holder is opened to the target holder;

first opening/closing driving means for opening/closing-driving the first shield member to one of the open state and the closed state;

a second shield member having a ring shape and installed on a surface of the substrate holder at an outer peripheral portion of the substrate; and driving means for moving the first shield member to move the first shield member in the closed state close to or away from the substrate holder with the second shield member being installed, the first shield member having at least one first projecting portion extending in a direction of the second shield member and having a ring shape, and the second shield member having at least one second projecting portion extending in a direction of the first shield member and having a ring shape, the method comprising:

a first step of causing the driving means to locate the first shield member such that the first projecting portion and the second projecting portion engage with each other in a noncontact state; and a second step of, after the first step, sputtering the target while maintaining the first projecting portion and the second projecting portion at a position to engage with each other in the noncontact state.

Advantageous Effects of Invention

According to the present invention, it is possible to provide an electronic device manufacturing method and a sputtering method, which, when performing discharge for conditioning and target cleaning in an apparatus for depositing a thin film on a substrate by sputtering at the time of manufacture of an electronic device, prevent sputtered particles from adhering to the substrate placing surface of a substrate holder so as to suppress contamination of the substrate or another manufacturing apparatus.

Other features and advantages of the present invention will be apparent from the following descriptions taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 4A is a view for explaining the positional relationship between the substrate shutter 19 and the substrate periphery cover ring 21;

FIG. 4B is a view for explaining the positional relationship between the substrate shutter 19 and the substrate periphery cover ring 21;

FIG. 4C is a view for explaining the positional relationship between the substrate shutter 19 and the substrate periphery cover ring 21;

FIG. 11 is a table showing a procedure of performing conditioning using the deposition apparatus according to the embodiment of the present invention;

FIG. 12 is a table for exemplarily explaining conditioning start conditions; and FIG. 13 is a graph showing a result obtained by measuring the number of particles adhered to a substrate once a day when processing shown in FIG. 10 was executed using the deposition apparatus according to the embodiment of the present invention.

DESCRIPTION OF EMBODIMENTS

A preferred embodiment of the present invention will now be described with reference to the accompanying drawings.

Figure 1A:
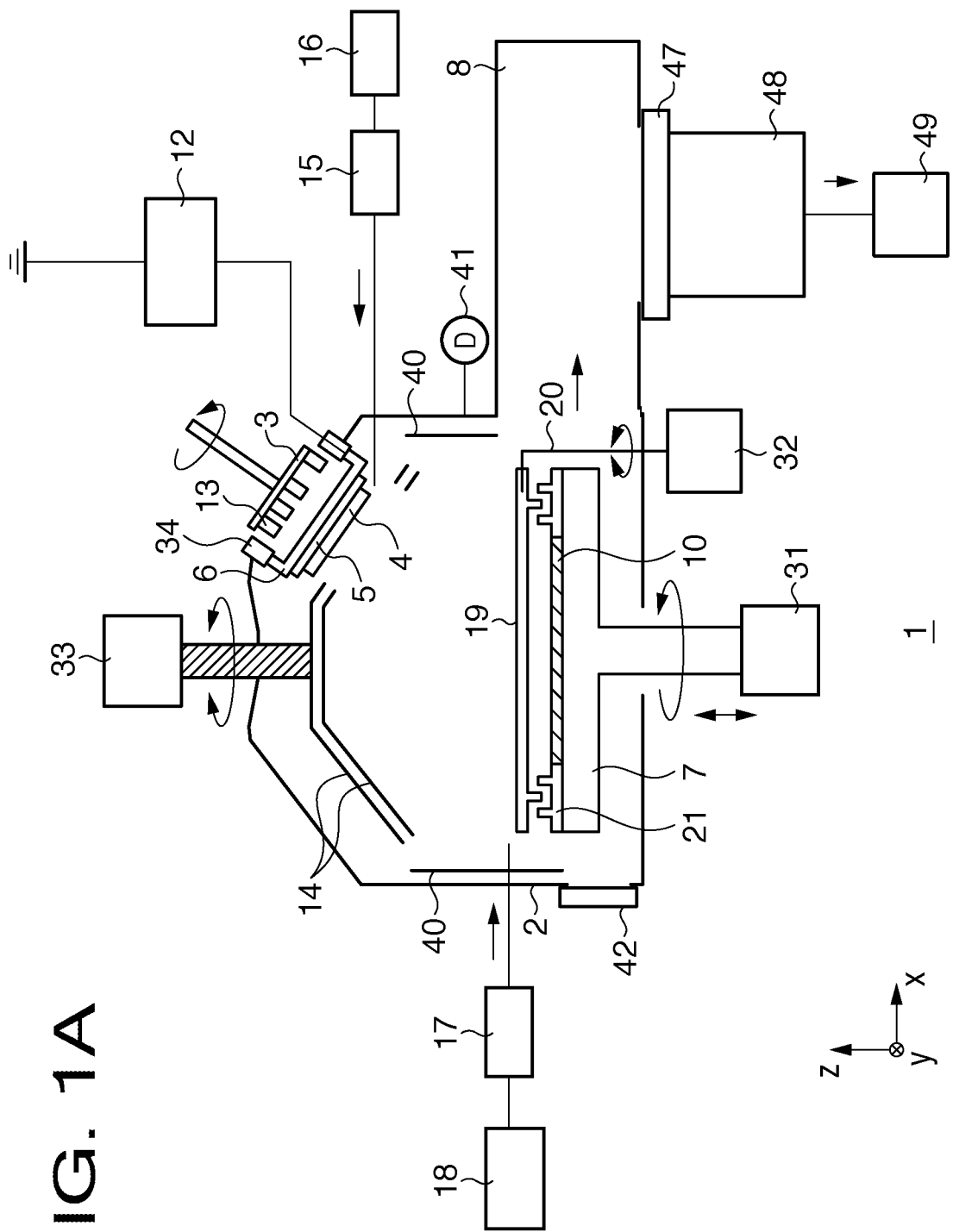
FIG. 1A is a schematic view of a deposition apparatus according to an embodiment of the present invention.

The overall arrangement of a sputtering apparatus (to be referred to as a "deposition apparatus" hereinafter) according to the present invention will be described with reference to FIGS. 1A, 1B, 2, and 3. FIG. 1A is a schematic view of a deposition apparatus 1 according to the embodiment of the present invention. The deposition apparatus 1 includes a vacuum container 2, a vacuum exhaust system that includes a turbo-molecular pump 48 and a dry pump 49 and exhausts the vacuum container 2 via an exhaust port 8, an inert gas introduction system 15 capable of introducing an inert gas into the vacuum container 2, and a reactive gas introduction system 17 capable of introducing a reactive gas.

The exhaust port 8 is a conduit having, for example, a rectangular section and connects the vacuum container 2 to the turbo-molecular pump 48. A main valve 47 configured to disconnect the deposition apparatus 1 and the turbo-molecular pump 48 from each other at the time of maintenance is provided between the exhaust port 8 and the turbo-molecular pump 48.

An inert gas supply device (gas cylinder) 16 configured to supply an inert gas is connected to the inert gas introduction system 15. The inert gas introduction system 15 is formed from a pipe configured to introduce an inert gas, a mass flow controller configured to control the flow rate of the inert gas, valves configured to stop and start gas supply, and a pressure reducing valve, a filter, and the like as needed, and configured to be able to stably flow a gas in a flow rate designated by a controller (not shown). The inert gas is supplied from the inert gas supply device 16 and then introduced to near a target 4 to be described later after its flow rate has been controlled by the inert gas introduction system 15.

A reactive gas supply device 18 configured to supply a reactive gas is connected to the reactive gas introduction system 17. The reactive gas introduction system 17 is formed from a pipe configured to introduce a reactive gas, a mass flow controller configured to control the flow rate of the inert gas, valves configured to stop and start gas flow, and a pressure reducing valve, a filter, and the like as needed, and configured to be able to stably flow a gas in a flow rate designated by a controller (not shown).

The reactive gas is supplied from the reactive gas supply device 18 and then introduced to near a substrate holder 7 that holds a substrate 10 to be described later after its flow rate has been controlled by the reactive gas introduction system 17. After introduced into the vacuum container 2, the inert gas and the reactive gas generate sputtered particles, as will be described later, or are used to form a film and then pass through the exhaust port 8 and are exhausted by the turbo-molecular pump 48 and the dry pump 49.

The vacuum container 2 is provided with a target holder 6 that holds the target 4 with an exposed sputtering surface by a back plate 5, and the substrate holder 7 that holds the substrate 10 at a predetermined position at which sputtered particles released from the target 4 arrive. The vacuum container 2 is also provided with a pressure gauge 41 configured to measure the pressure in the vacuum container 2. The inner surface of the vacuum container 2 is electrically grounded. A cylindrical shield 40 that is electrically grounded is provided on the inner surface of the vacuum container 2 between the target holder 6 and the substrate holder 7. The shield 40 prevents the sputtered particles from directly adhering to the inner surface of the vacuum container 2 and has an exchangeable structure.

A magnet 13 for implementing magnetron sputtering is disposed behind the target 4 viewed from the sputtering surface. The magnet 13 is held by a magnet holder 3 and is rotatable by a magnet holder rotation mechanism (not shown). To uniformly erode the target, the magnet holder 3 rotates during discharge.

The target 4 is installed at a position (offset position) obliquely above the substrate 10. That is, the center point of the sputtering surface of the target 4 is located at a position shifted from the normal to the center point of the substrate 10 by a predetermined distance. A power supply 12 that applies a sputtering discharge power is connected to the target holder 6. The deposition apparatus 1 shown in FIG. 1A includes a DC power supply. However, the present invention is not limited to this, and the deposition apparatus may include, for example, an RF power supply. When an RF power supply is used, a matching device is installed between the power supply 12 and the target holder 6.

The target holder 6 is insulated from the vacuum container 2 by an insulator 34, and serves as an electrode when a DC or RF power is applied because it is made of a metal such as Cu. Note that the target holder 6 has a waterway (not shown) inside and is configured to be cooled by cooling water supplied from a water pipe (not shown). The target 4 is made of a material component to be deposited on the substrate. The material preferably has a high purity because it concerns the purity of the film. The back plate 5 installed between the target 4 and the target holder 6 is made of a metal such as Cu and holds the target 4. Alternatively, the target 4 may be fixed directly to the target holder 6 without using the back plate 5. In this case, the shape of the target problematically becomes complex. On the other hand, the reliability can be improved because the back plate and the target need not be bonded.

A target shutter 14 is installed near the target holder 6 so as to cover the target holder 6. The target shutter 14 functions as a shield member (third shield member) configured to set a closed state in which the target holder 6 is shielded from the substrate holder 7 or an open state in which the target holder 6 is opened to the substrate holder 7. The target shutter 14 is provided with a target shutter driving mechanism 33.

A second shield member (to be also referred to as a "substrate periphery cover ring 21" hereinafter) having a ring shape is provided on the substrate placing surface side of the substrate holder 7 at the outer edge (outer peripheral portion) of the substrate 10. The substrate periphery cover ring 21 prevents sputtered particles from adhering to places other than the deposition surface of the substrate 10. The places other than the deposition surface include the side and lower surfaces of the substrate 10 in addition to a portion of the substrate holder 7 covered by the substrate periphery cover ring 21. The substrate holder 7 is provided with a substrate holder driving mechanism 31 configured to move the substrate holder 7 in the vertical direction or rotate it at a predetermined velocity. The substrate holder driving mechanism 31 can move the substrate holder 7 in the vertical direction to move the substrate holder 7 up toward a substrate shutter 19 (first shield member) in the closed state or down toward the substrate shutter 19 (first shield member).

The substrate shutter 19 is arranged near the substrate 10 between the substrate holder 7 and the target holder 6. The substrate shutter 19 is supported by a substrate shutter support member 20 to cover the surface of the substrate 10. When a substrate shutter driving mechanism 32 rotates the substrate shutter support member 20, the substrate shutter 19 is inserted between the target 4 and the substrate 10 (closed state). At this time, the substrate 10 is shielded from the target 4. Similarly, when the substrate shutter driving mechanism 32 operates to make the substrate shutter 19 retreat from between the target holder 6 (target 4) and the substrate holder 7 (substrate 10), the substrate holder 7 (substrate 10) is opened to the target holder 6 (target 4) (open state). The substrate shutter driving mechanism 32 thus opens/closes the substrate shutter 19 to set the closed state in which the substrate holder 7 is shielded from the target holder 6 or the open state in which the substrate holder 7 is opened to the target holder 6.

The substrate shutter 19 is configured to be able to retreat into the exhaust port 8. As shown in FIG. 1A, when the substrate shutter 19 retreats and is stored in the conduit of the exhaust path up to the turbo-molecular pump 48 for high-vacuum exhaustion, the area of the apparatus can be reduced.

The substrate shutter 19 is made of stainless steel or an aluminum alloy. If heat resistance is necessary, it may be made of titanium or a titanium alloy. The surface of the substrate shutter 19 is blast-worked by sandblast or the like so that the surface has a small unevenness. Hence, a film adhered to the substrate shutter 19 hardly peels off, and particles generated by peeling can be reduced. Other than the blast working, a thin metal film may be formed on the surface of the substrate shutter 19 by metal spraying or the like. In this case, performing spraying is more expensive than performing only blast working. However, when detaching the substrate shutter 19 and removing the adhered film, the film adhered upon sputtering need only be dissolved together with the sprayed film using a chemical solution or the like. Hence, the shutter is not physically damaged. In addition, since a flexible Al film increases the adhesion to the sputtered film, the sputtered film is prevented from peeing off by the stress of its own.

The shapes of the substrate periphery cover ring 21 and the substrate shutter 19 will be described next with reference to FIGS. 2 and 3. FIG. 3 is a view showing the schematic structure of the substrate periphery cover ring 21 facing the substrate shutter 19. The substrate periphery cover ring 21 includes projecting portions each having a ring shape and extending toward the substrate shutter 19. That is, the substrate periphery cover ring 21 has a ring shape and includes concentric projecting portions (projections 21a and 21b) on its surface facing the substrate shutter 19.

Figure 2:
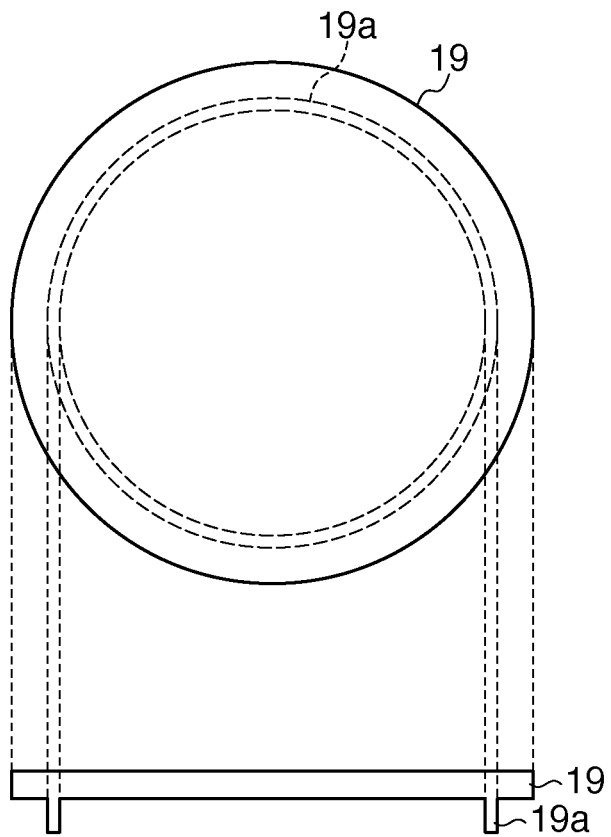
FIG. 2 is a view showing the schematic structure of a substrate shutter 19 facing a substrate periphery cover ring 21.
Figure 3:
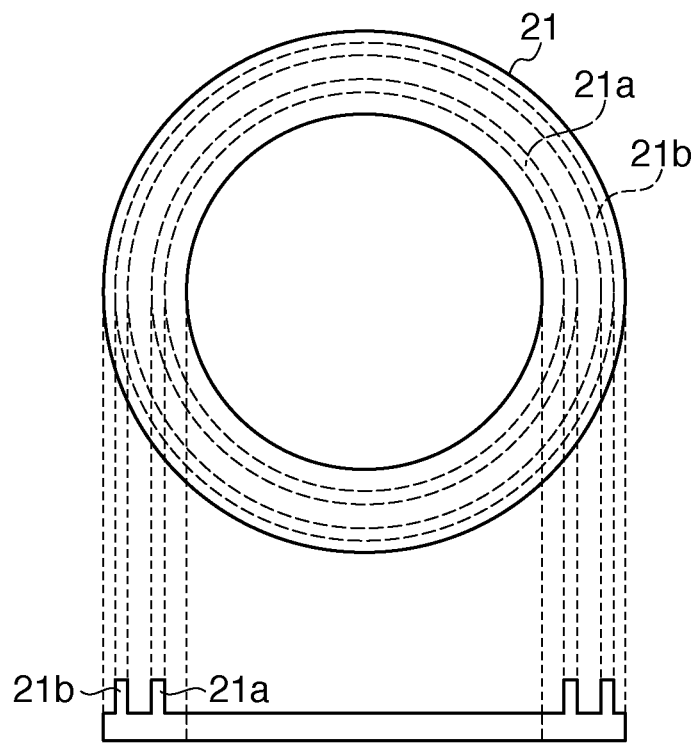
FIG. 3 is a view showing the schematic structure of the substrate periphery cover ring 21 facing the substrate shutter 19.

FIG. 2 is a view showing the schematic structure of the substrate shutter 19 facing the substrate periphery cover ring 21. The substrate shutter 19 includes a projecting portion having a ring shape and extending toward the substrate periphery cover ring 21. The substrate shutter 19 includes a projecting portion (projection 19a) on its surface facing the substrate periphery cover ring 21. Note that the circumference becomes large in the order of the projections 21a, 19a, and 21b.

At the position where the substrate holder is moved up by the substrate holder driving mechanism 31, the projection 19a and the projections 21a and 21b engage with each other in a noncontact state. Alternatively, at the position where the substrate shutter 19 is moved down by the substrate shutter driving mechanism 32, the projection 19a and the projections 21a and 21b engage with each other in a noncontact state. In this case, the projection 19a engages with the concave portion formed by the projections 21a and 21b in a noncontact state.

Figure 1B:
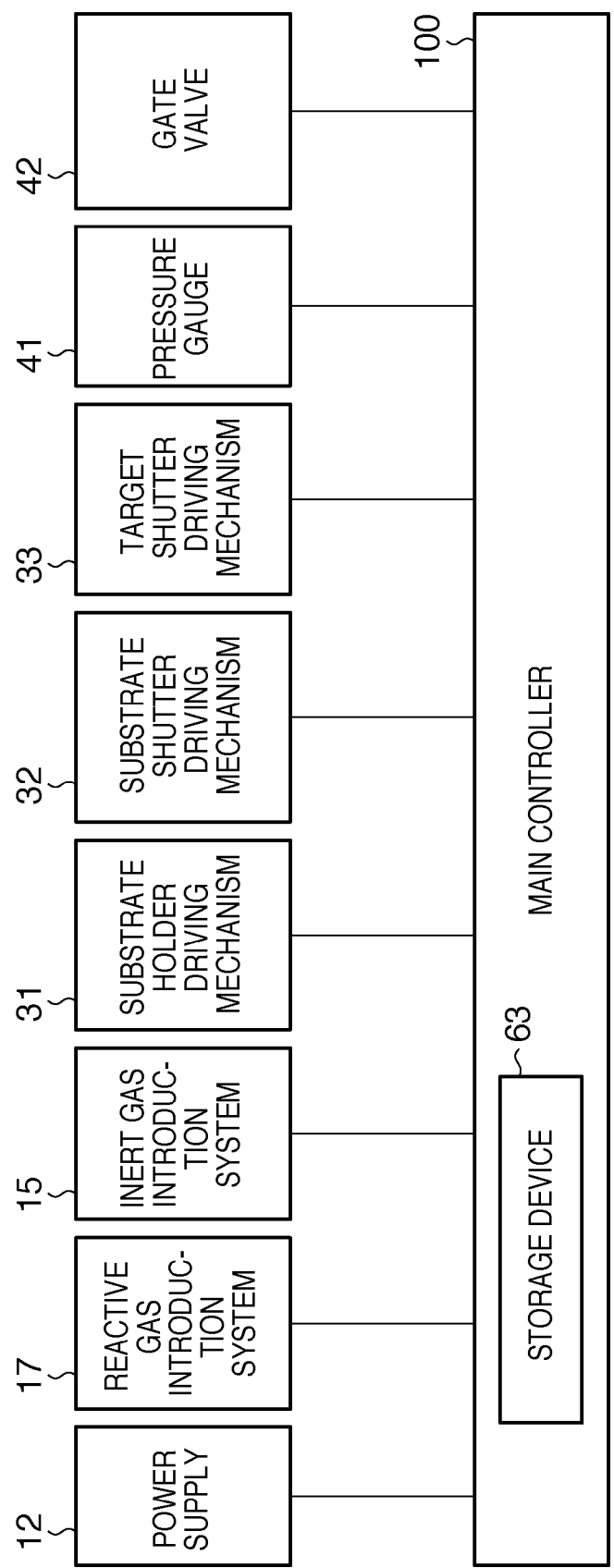
FIG. 1B is a block diagram of a main controller configured to operate the deposition apparatus shown in FIG. 1A.

FIG. 1B is a block diagram of a main controller 100 configured to operate the deposition apparatus 1 shown in FIG. 1A. The main controller 100 is electrically connected to the power supply 12 for applying a sputtering discharge power, the inert gas introduction system 15, the reactive gas introduction system 17, the substrate holder driving mechanism 31, the substrate shutter driving mechanism 32, the target shutter driving mechanism 33, the pressure gauge 41, and a gate valve and configured to manage and control the operation of the deposition apparatus to be described later.

Note that a storage device 63 provided in the main controller 100 stores a control program to execute a deposition method or the like including conditioning and presputtering according to the present invention. For example, the control program is implemented as a mask ROM. The control program can also be installed in the storage device 63 formed from a hard disk drive (HDD) or the like via an external recording medium or a network.

The positional relationship between the substrate shutter 19 and the substrate periphery cover ring 21 will be explained next with reference to FIGS. 4A to 4C. FIG. 4A illustrates a state (to be referred to as a "position A" hereinafter) in which the substrate shutter 19 and the substrate periphery cover ring 21 come close to each other, and the projecting portions on the surfaces facing are combined to form a labyrinth seal. Note that the labyrinth seal is a kind of noncontact seal in which the projecting portions (the concave portion ford by the projections 21a and 21b and the convex portion formed by the projection 19a) formed on the surfaces facing engage with each other to form a noncontact state, that is, a predetermined gap is formed between the concave portion and the convex portion. Sputtered particles released from the target have a characteristic to travel straight forward in the sputtering chamber, and cannot therefore pass through the gap between the convex portion and the concave portion. It is therefore possible to prevent the sputtered particles from adhering to the surface of the substrate holder 7 and the like.

In the state (position A) shown in FIG. 4A in which the labyrinth seal is formed, let H1 be the projection height from the flat surface of the substrate shutter 19, H2 be the projection height from the flat surface of the substrate periphery cover ring 21, and D1 be the distance between the flat surface of the substrate shutter 19 and that of the substrate periphery cover ring 21. At this time, in the state (position A) in which the labyrinth seal is formed, a relationship D1<H1+H2 is satisfied.

In the state at the position A in which the labyrinth seal is formed, the three projections, that is, the projection 19a of the substrate shutter 19 and the substrate periphery cover rings 21a and 21b engage with each other. Note that since conditioning processing is performed in this state, it is possible to prevent the sputtered particles from adhering to the surface of the substrate holder 7.

FIG. 4B illustrates a state (to be referred to as a "position B" hereinafter) in which a minimum distance is maintained not to make the substrate shutter 19 and the substrate periphery cover ring 21 into contact each other at the time of opening/closing the substrate shutter 19. At the position B, a relationship D1>H1+H2 is satisfied.

FIG. 4C illustrates a state (to be referred to as a "position C" hereinafter) in which the distance between the substrate shutter 19 and the substrate holder 7 has increased to maximum. At this time, a substrate can be transported to the substrate placing surface of the substrate holder 7 from the gap formed between the substrate shutter 19 and the substrate periphery cover ring 21 in the state at the position C. In this embodiment, the substrate holder 7 is moved in the vertical direction to move the position of the substrate periphery cover ring 21 and adjust the interval between the substrate shutter 19 and the substrate periphery cover ring 21. However, the present invention is not limited to this example. For example, the substrate shutter driving mechanism 32 may be configured to move the substrate shutter 19 in the vertical direction. That is, the substrate shutter driving mechanism 32 can move the substrate shutter 19 (first shield member) in the vertical direction to move the substrate shutter 19 (first shield member) in the closed state down toward the substrate holder 7 on which the substrate periphery cover ring 21 (second shield member) is installed or up toward the substrate holder 7.

Alternatively, the substrate shutter driving mechanism 32 and the substrate holder driving mechanism 31 may move the substrate shutter 19 and the substrate holder 7 in the vertical direction, respectively, to set the state at the position C.

In this embodiment, the substrate shutter support member 20 opens/closes the substrate shutter 19 by a rotation operation. However, if it is possible to opening/closing between the target 4 and the substrate 10, the substrate shutter 19 may be slid in the horizontal direction using, for example, a rectilinear lead-in mechanism.

(Operation Upon Conditioning)

An operation of the deposition apparatus 1 upon conditioning will be described next with reference to FIGS. 5A to 5F. Note that conditioning processing means processing of performing discharge and adhering sputtered particles to the inner surface of the chamber and the like to stabilize the deposition characteristic while keeping the substrate shutter 19 closed not to affect deposition on the substrate.

First, the main controller 100 instructs the substrate shutter driving mechanism 32 to close the substrate shutter 19. Next, the main controller 100 instructs the target shutter driving mechanism 33 to close the target shutter 14. The target shutter 14 and the substrate shutter 19 are closed in accordance with the instructions from the main controller 100. In this state, the substrate holder 7 is arranged at the position C that is the standby position.

Figure 5A:
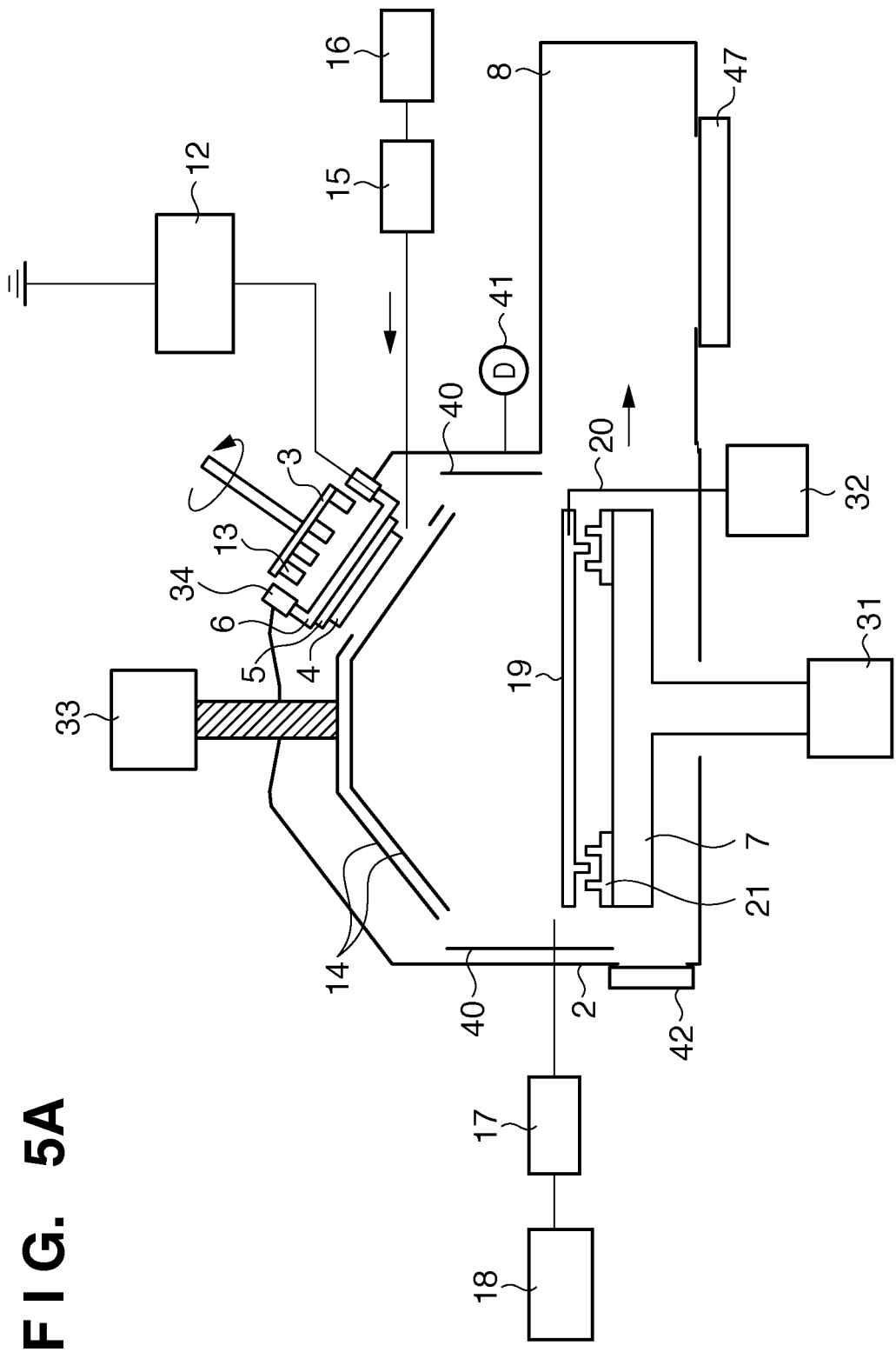
FIG. 5A is a view for explaining the operation procedure of the deposition apparatus upon conditioning.

The main controller 100 subsequently instructs the substrate holder driving mechanism 31 to execute a rising operation so that the substrate holder 7 moves from the position C (FIG. 4C) that is the standby position up to the position (position A (FIG. 4A)) where the labyrinth seal is formed (FIG. 5A).

Figure 5B:
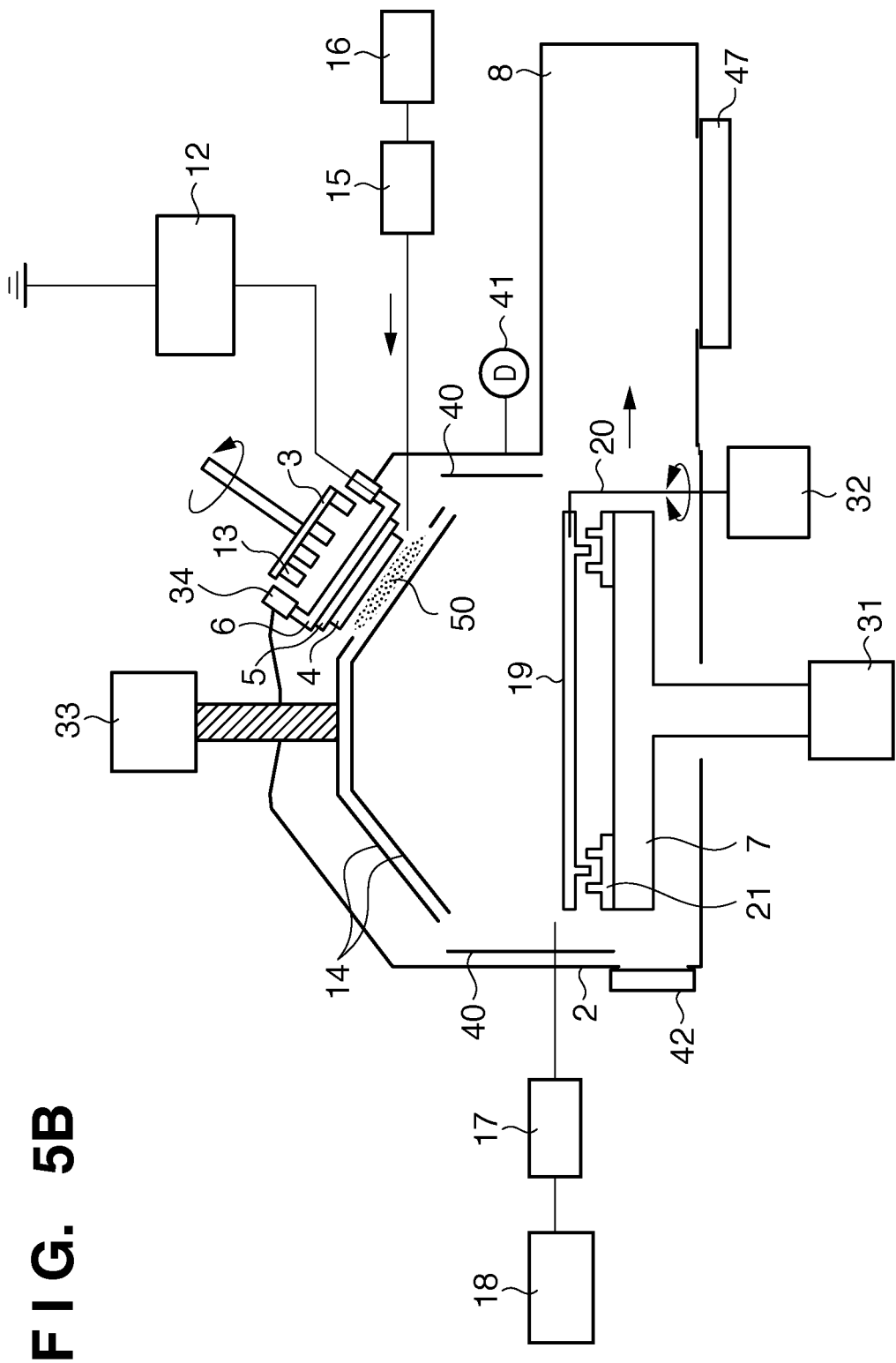
FIG. 5B is a view for explaining the operation procedure of the deposition apparatus upon conditioning.

The main controller 100 instructs the controller for controlling the inert gas introduction system 15 to introduce an inert gas (Ne, Kr, or Xe besides Ar) from the inert gas introduction system 15 in the vicinity of the target while keeping the target shutter 14 closed, as shown in FIG. 5B. At this time, the inert gas is introduced to the vicinity of the target, as shown in FIG. 5B. Hence, the pressure in the vicinity of the target is higher than that around the substrate, and discharge readily occurs. In this state, the power supply 12 applies a power to the target, thereby starting discharge. Since the labyrinth seal is formed between the substrate shutter 19 and the substrate periphery cover ring 21, sputtered particles can be prevented from adhering to the substrate placing surface of the substrate holder 7.

Figure 5C:
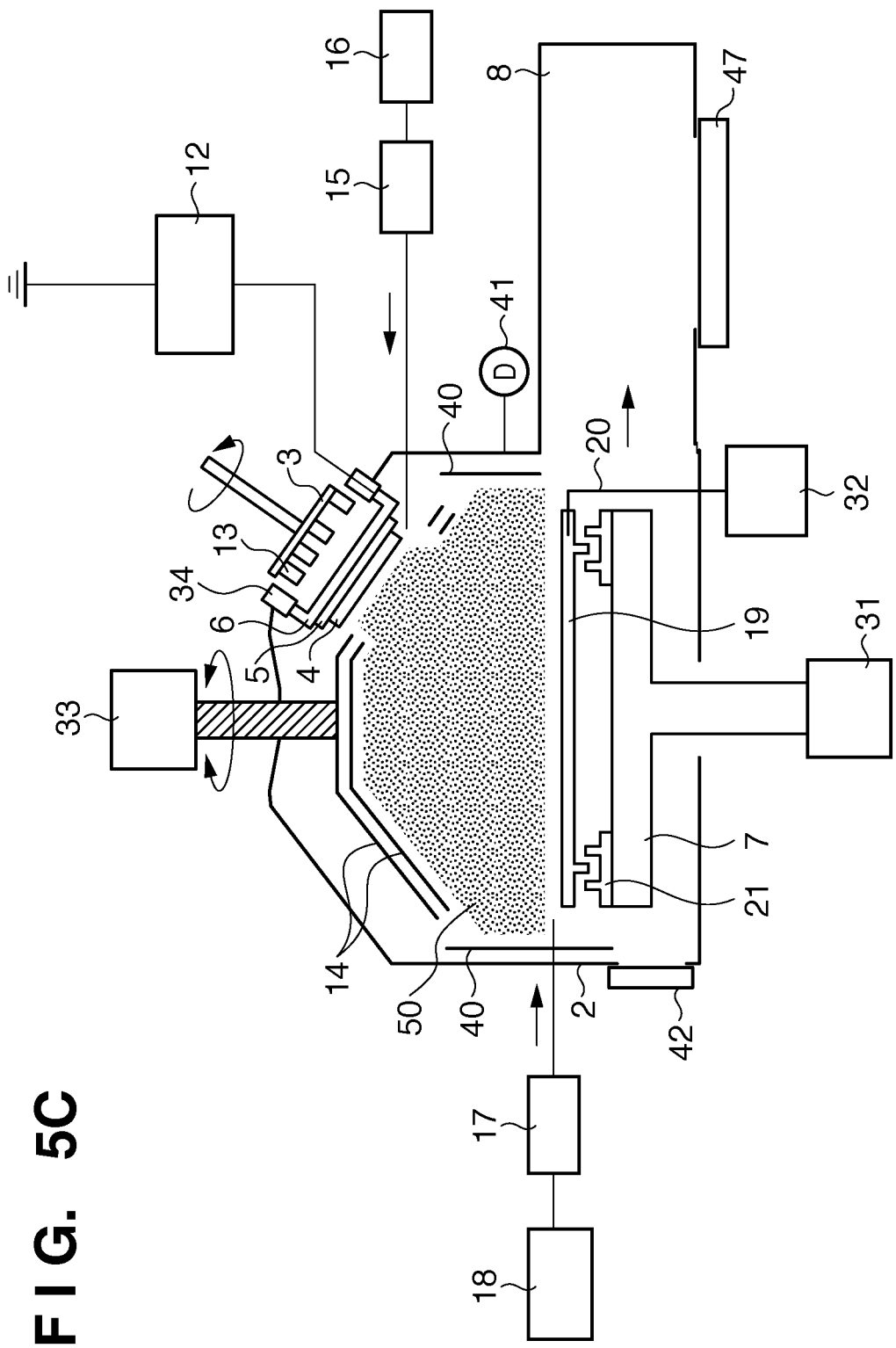
FIG. 5C is a view for explaining the operation procedure of the deposition apparatus upon conditioning.

The main controller 100 instructs to drive the target shutter driving mechanism 33 and open the target shutter 14, as shown in FIG. 5C. Conditioning to the inner wall of the chamber thus starts. The sputtered particles released from the target 4 adhere to the inner wall of the chamber, and a film is deposited. Note that when the shield 40 is provided on the inner wall, the sputtered particles adhere to the surface of the shield 40, and a film is deposited. However, since the labyrinth seal is formed between the substrate shutter 19 and the substrate periphery cover ring 21, the sputtered particles can be prevented from wrapping around to the substrate placing surface of the substrate holder 7. In this state, conditioning is performed to form a film on the inner wall of the chamber or a constituent member such as a shield. Thus performing conditioning allows to stabilize the reaction between the sputtered particles and the reactive gas in the open state of the target shutter. Note that to perform conditioning by reactive sputtering discharge, a reactive gas is introduced from the reactive gas introduction system 17 to the vicinity of the substrate.

Figure 5D:
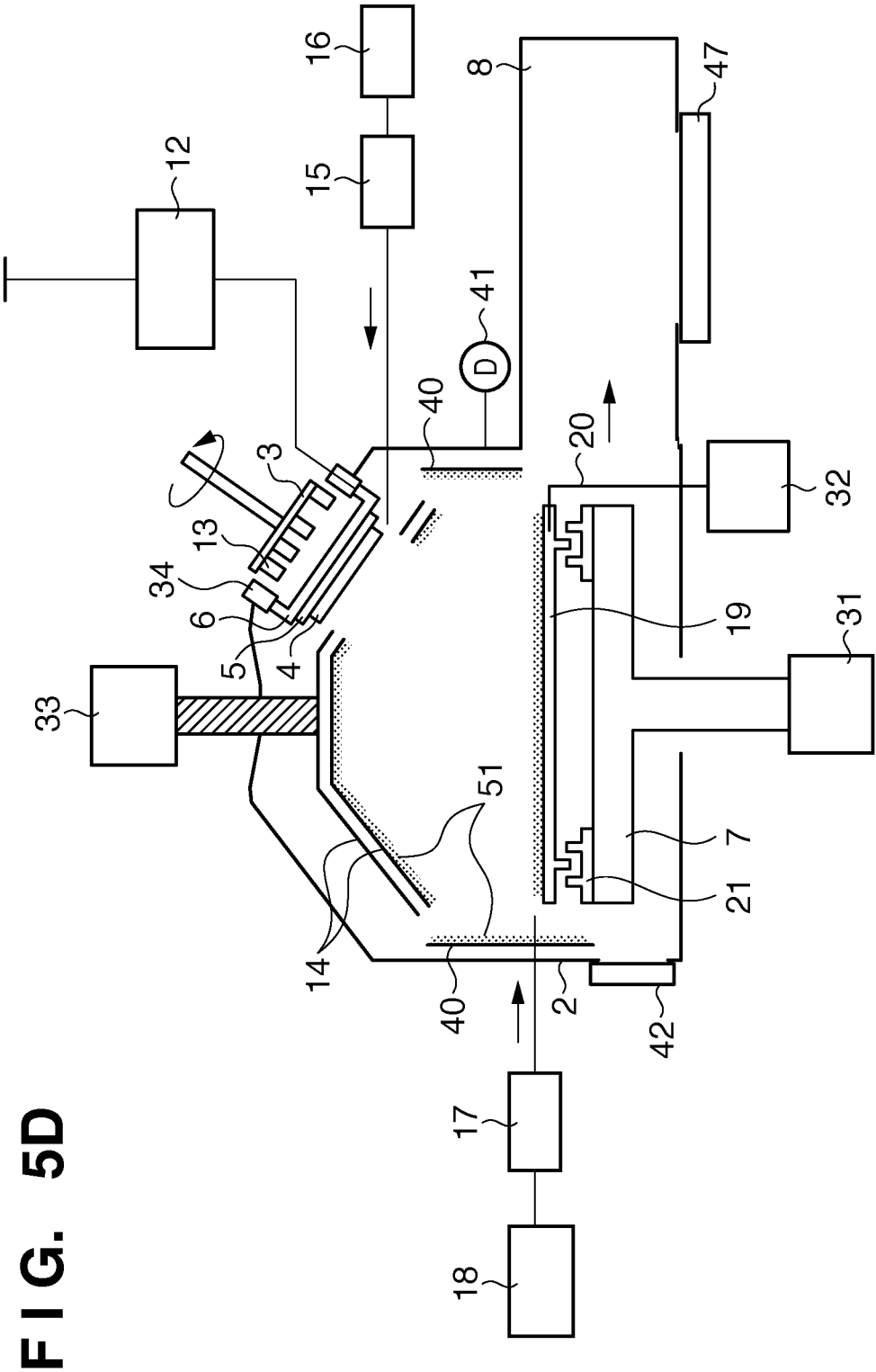
FIG. 5D is a view for explaining the operation procedure of the deposition apparatus upon conditioning.
Figure 5E:
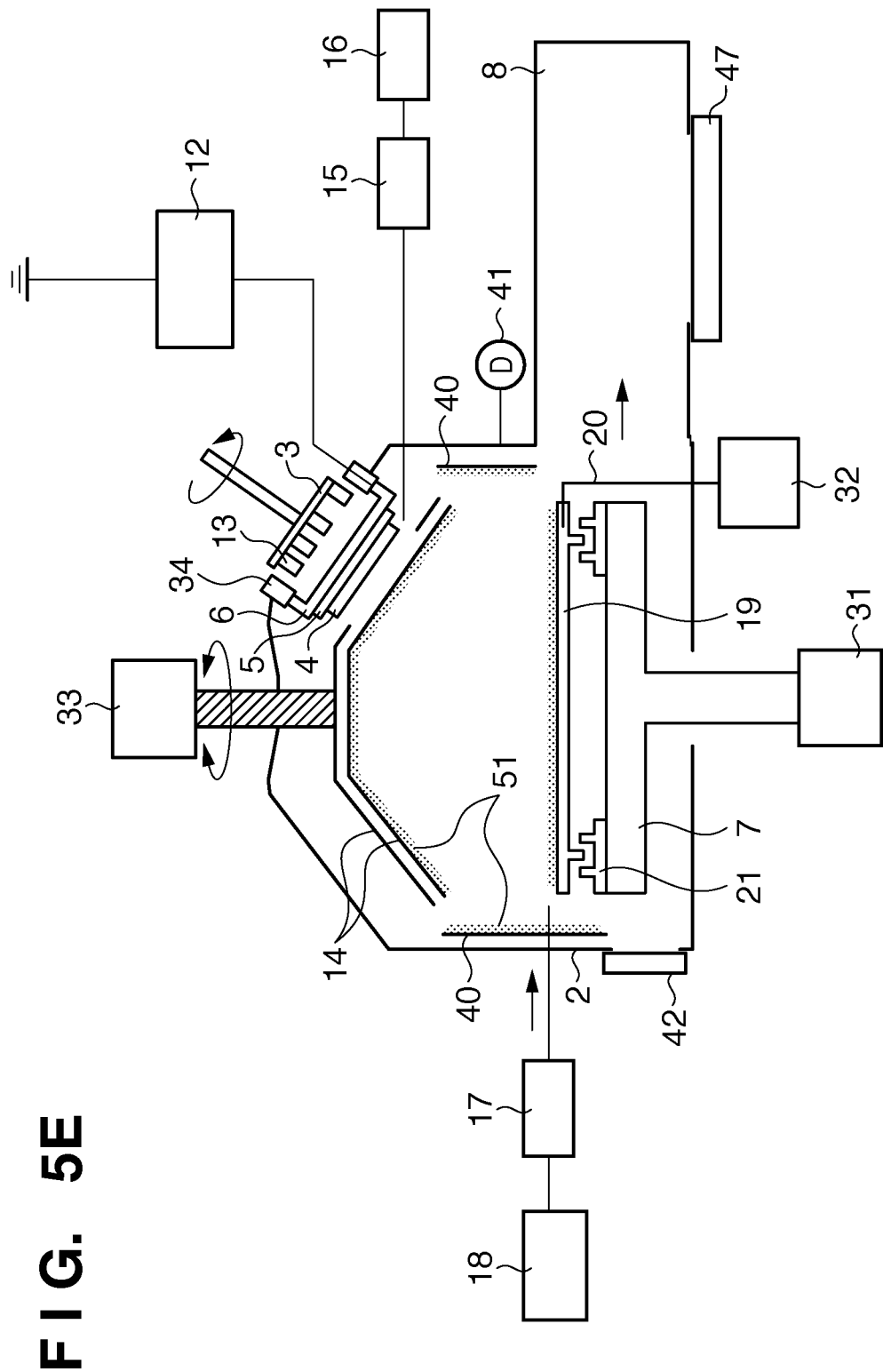
FIG. 5E is a view for explaining the operation procedure of the deposition apparatus upon conditioning.

After discharge is performed for a predetermined time, the main controller 100 causes the power supply 12 to stop power application, thereby stopping the discharge (FIG. 5D). At this time, deposited films 51 have been formed on the shield 40, the target shutter 14, the substrate shutter 19, and other surfaces facing the target.

the main controller 100 instructs the controller for controlling the inert gas introduction system 15 to stop supply of the inert gas, as shown in FIG. 5E. If a reactive gas is being supplied, the main controller 100 instructs the reactive gas introduction system 17 to stop supply of the reactive gas, too. After that, the main controller 100 instructs the target shutter driving mechanism 33 to close the target shutter 14.

Figure 5F:
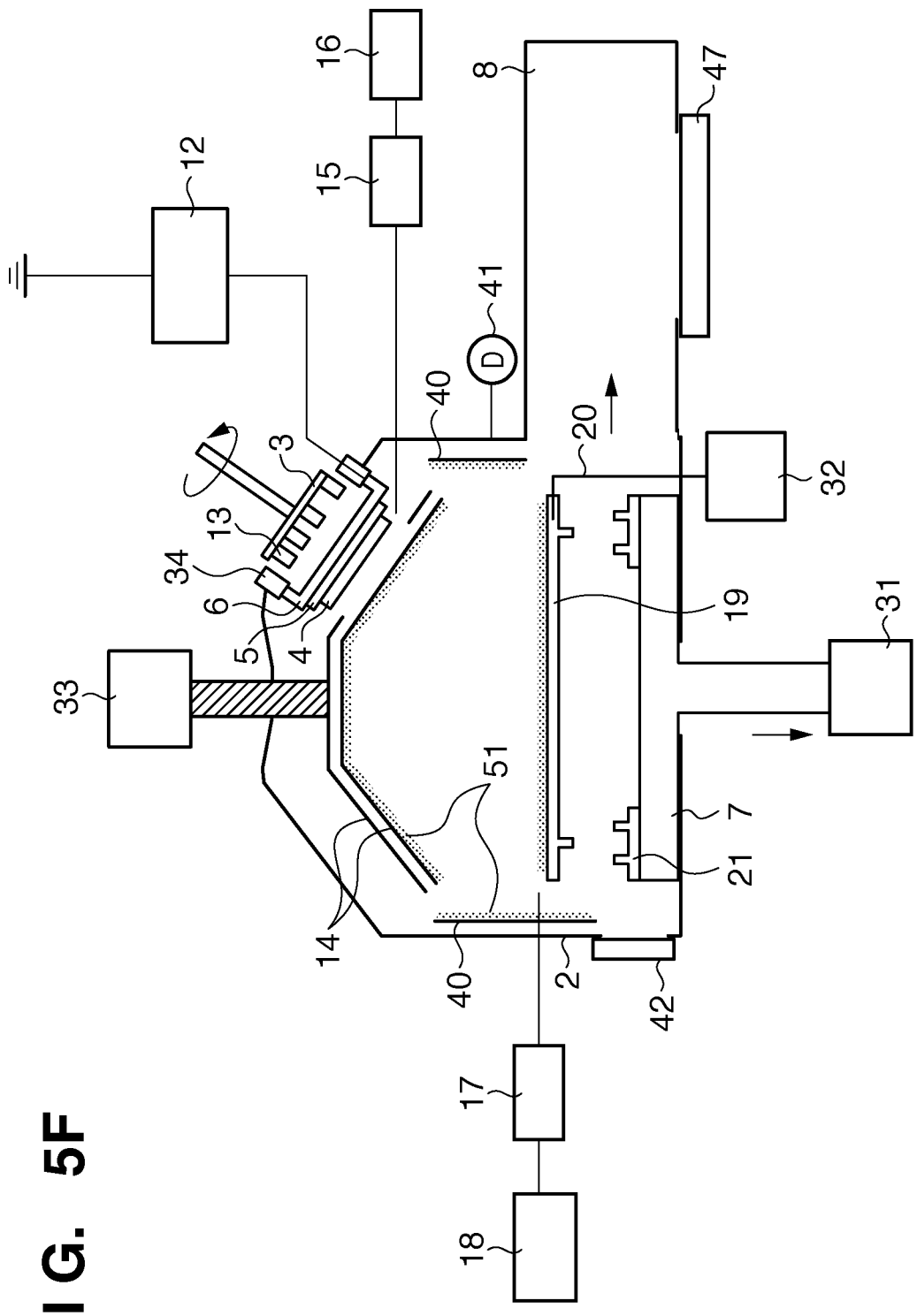
FIG. 5F is a view for explaining the operation procedure of the deposition apparatus upon conditioning.

The main controller 100 instructs the substrate holder driving mechanism 31 to move the substrate holder 7 from the position A to the position C, as shown in FIG. 5F, thereby completing the conditioning.

With the above-described procedure, the conditioning can be performed while preventing the sputtered particles from wrapping around to the substrate placing surface of the substrate holder 7.

Note that an operation upon target cleaning of removing an impurity or an oxide adhered to the target before deposition can be implemented in accordance with the same procedure as in the above-described operation upon conditioning.

(Presputtering Operation and Deposition on Substrate)

The operation of the deposition apparatus 1 when performing a presputtering operation and deposition on a substrate will be described next with reference to FIGS. 6A to 6I. Presputtering is sputtering to be performed to stabilize discharge while keeping the shutter closed not to affect deposition on the substrate. Presputtering is always performed before deposition on each substrate.

Figure 6A:
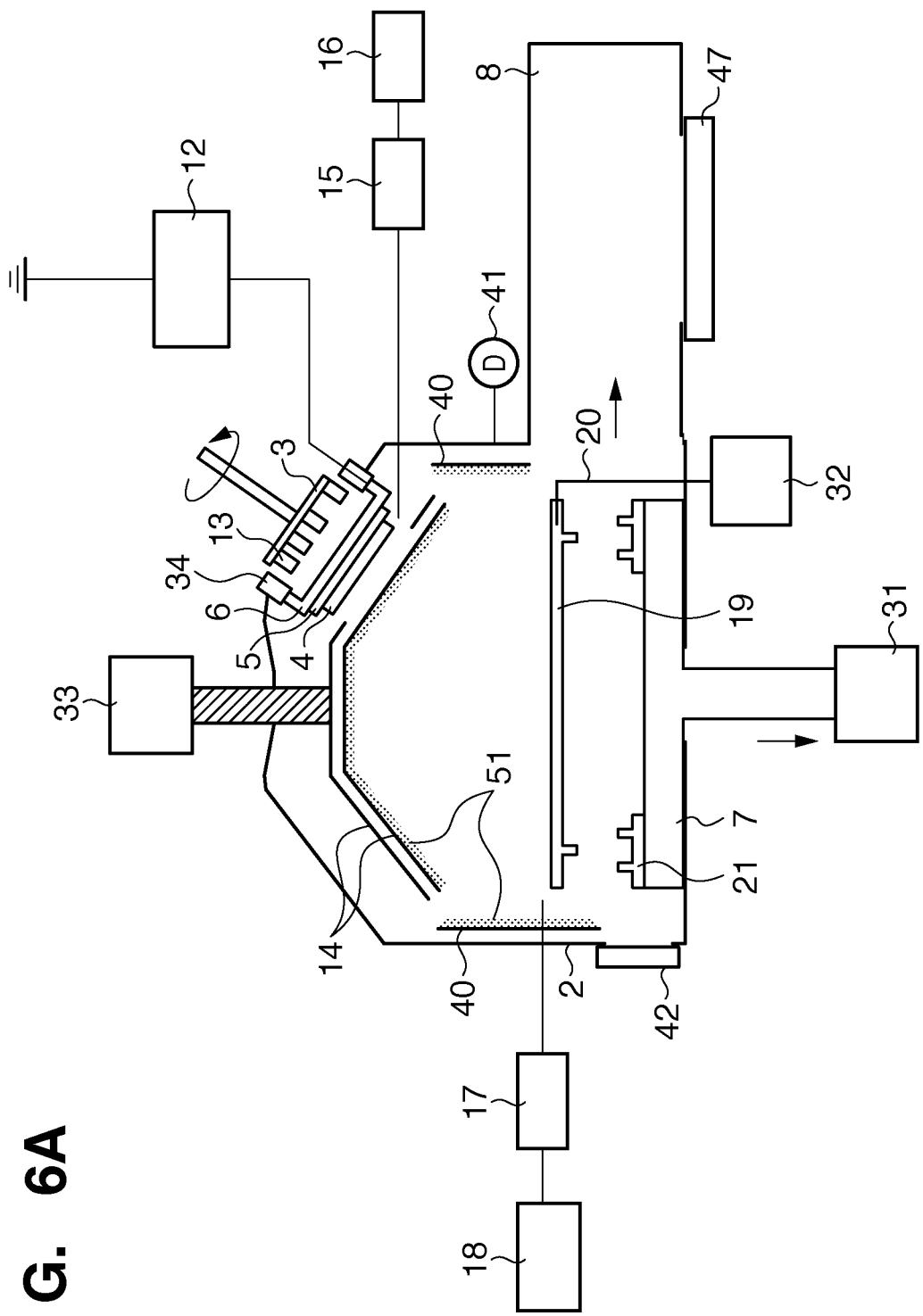
FIG. 6A is a view for explaining the operation of the deposition apparatus when performing a presputtering operation and deposition on a substrate.

First, the main controller 100 instructs the substrate shutter driving mechanism 32 to close the substrate shutter 19 (set the state at the position A). Next, the main controller 100 instructs the target shutter driving mechanism 33 to close the target shutter 14. The target shutter 14 and the substrate shutter 19 are thus closed (FIG. 6A). In this state, the substrate holder 7 is arranged at the position C that is the standby position.

Figure 6B:
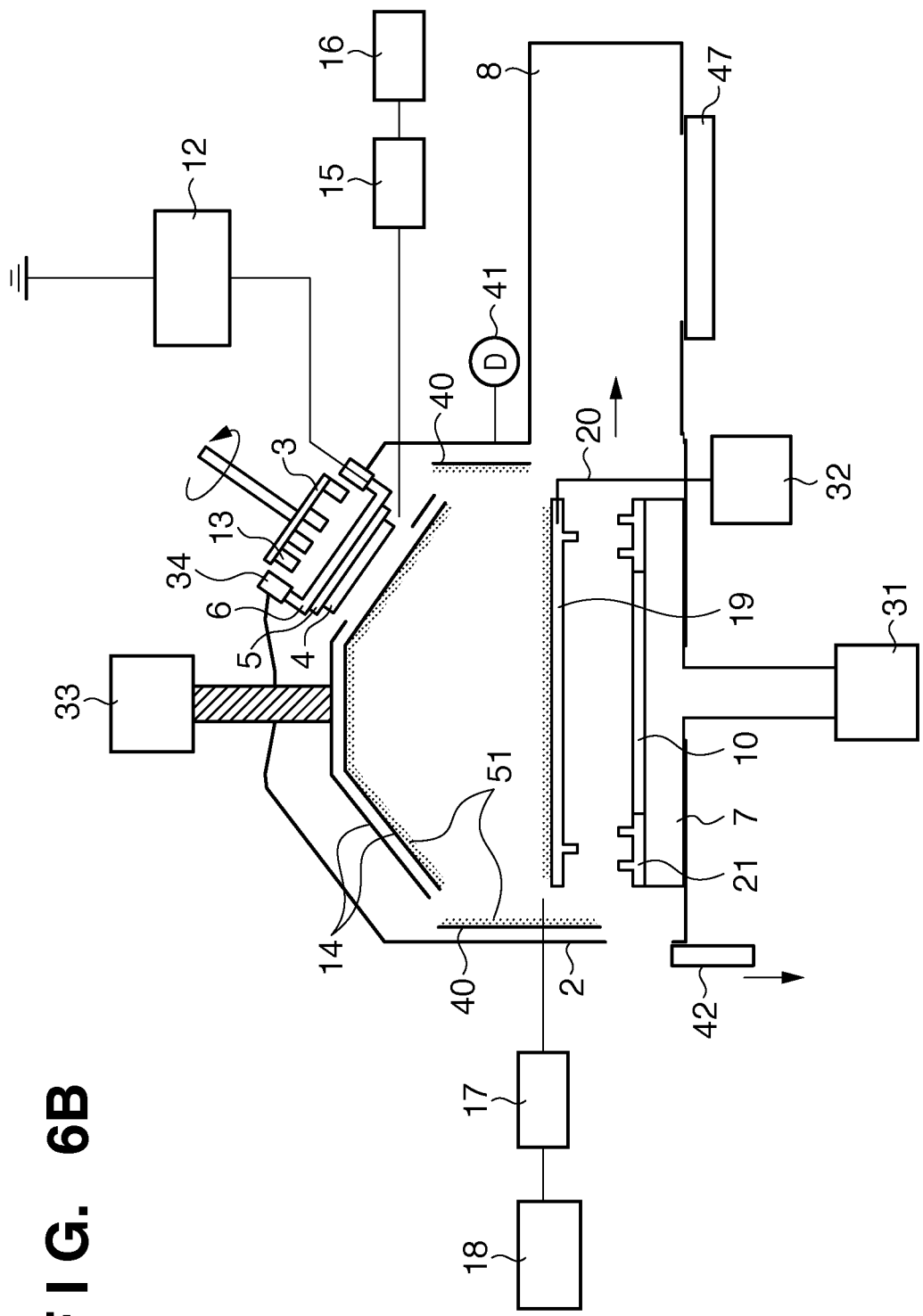
FIG. 6B is a view for explaining the operation of the deposition apparatus when performing a presputtering operation and deposition on a substrate.

The main controller 100 instructs to open a gate valve 42 on the chamber wall, as shown in FIG. 6B, and load the substrate 10 from the gate valve 42 by a substrate transport means (not shown) outside the chamber. The substrate 10 is loaded from between the substrate shutter 19 and the substrate periphery cover ring 21 and placed on the substrate placing surface of the substrate holder 7 cooperatively by the substrate transport means outside the chamber and a lift mechanism (not shown) in the substrate holder.

Figure 6C:
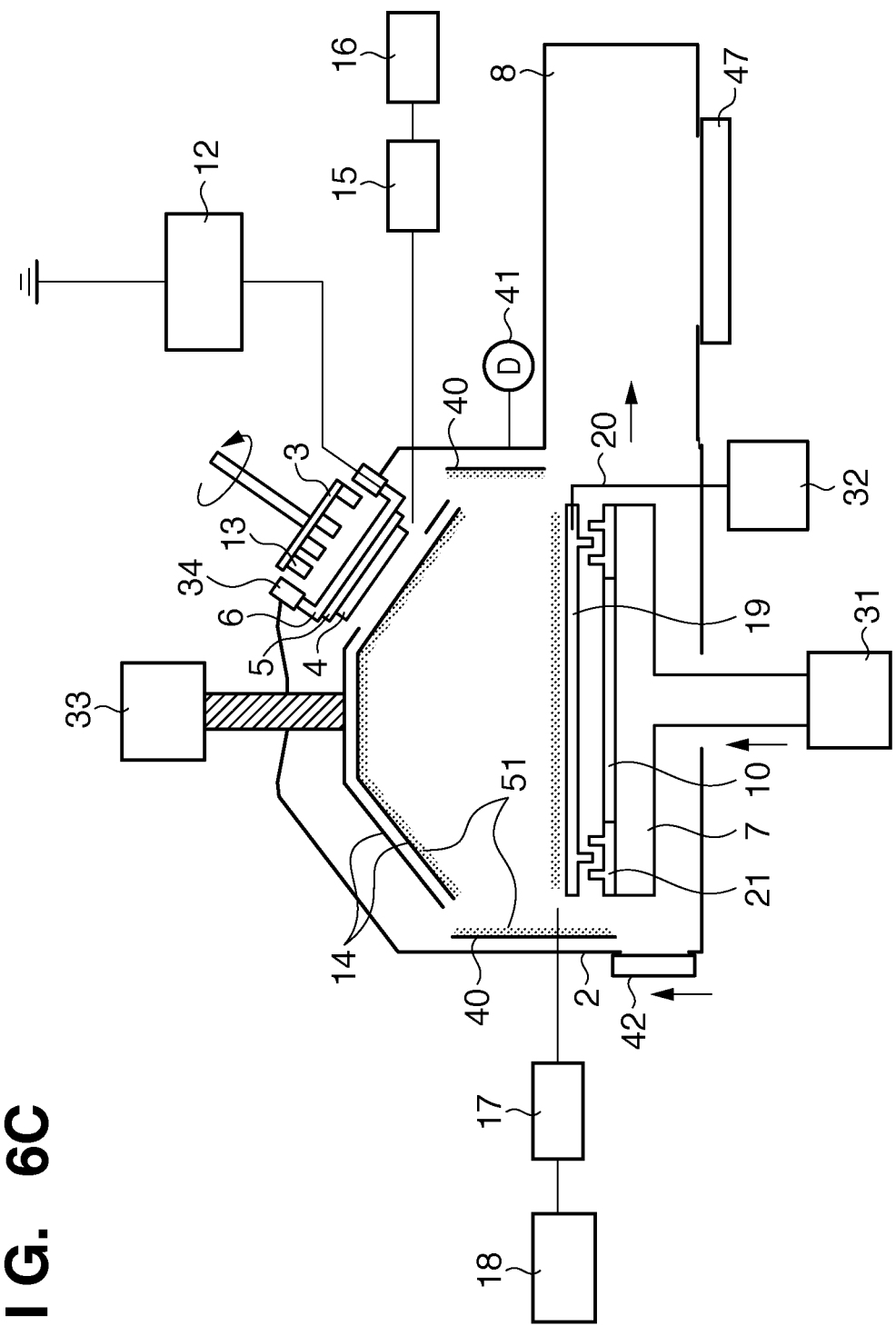
FIG. 6C is a view for explaining the operation of the deposition apparatus when performing a presputtering operation and deposition on a substrate.

The main controller 100 closes the gate valve 42, as shown in FIG. 6C, and causes the substrate holder driving mechanism 31 to move the substrate holder 7 from the position C (FIG. 4C) to the position B (FIG. 4B). The position B is preferably a point where the positional relationship between the target 4 and the substrate 10 is optimum from the viewpoint of the deposition distribution and the like.

Figure 6D:
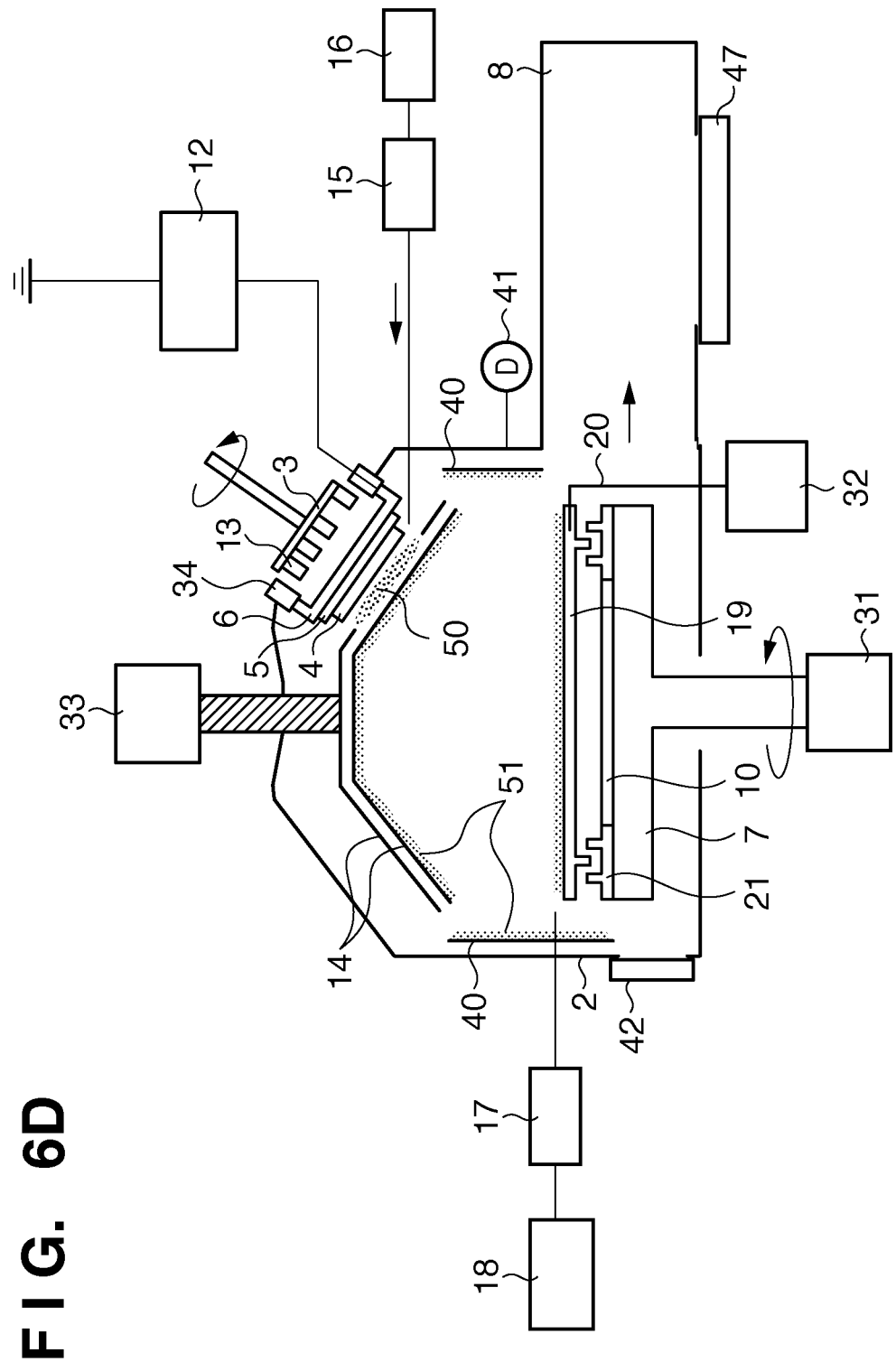
FIG. 6D is a view for explaining the operation of the deposition apparatus when performing a presputtering operation and deposition on a substrate.

The main controller 100 drives the substrate holder driving mechanism 31, thereby rotating the substrate holder 7, as shown in FIG. 6D. An inert gas (Ne, Kr, or Xe besides Ar) is introduced from the inert gas introduction system 15 provided in the vicinity of the target. The main controller 100 causes the power supply 12 to apply a power to the target, thereby starting sputtering. Thus starting sputtering while keeping the substrate shutter 19 closed allows to prevent sputtered particles from adhering to the substrate.

Figure 6E:
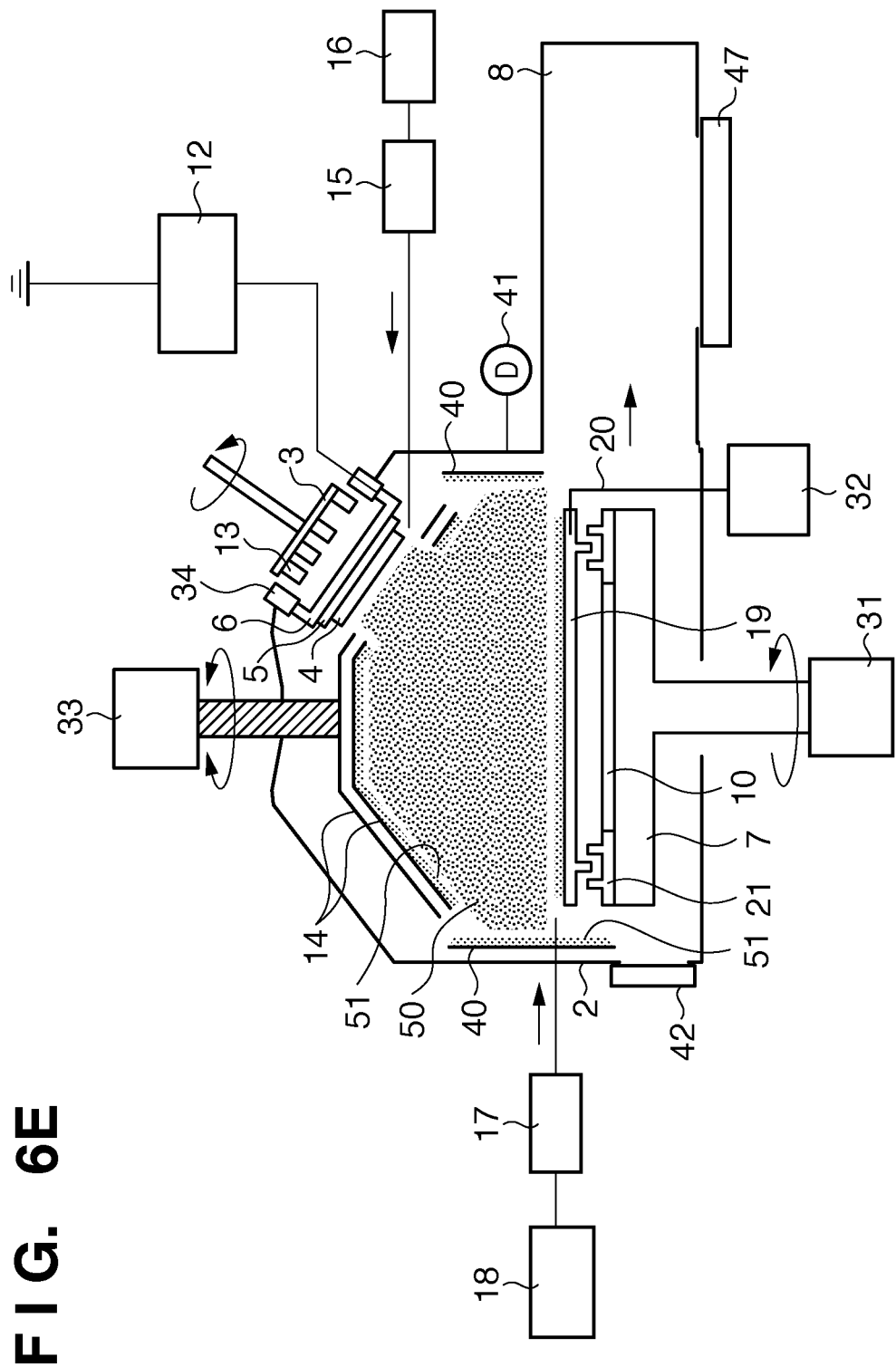
FIG. 6E is a view for explaining the operation of the deposition apparatus when performing a presputtering operation and deposition on a substrate.

After a predetermined discharge stabilizing time (3 to 15 sec) for stabilizing the discharge, the main controller 100 opens the target shutter 14 and starts presputtering, as shown in FIG. 6E. Note that if an abnormality such as a failure in starting discharge has occurred at this time, the main controller 100 can detect it by monitoring the discharge voltage/current and stop the deposition sequence. If no problem is posed, the target shutter 14 is opened, as described above. Hence, the sputtered particles adhere to the inner wall of the shield, and a film is deposited. Note that to perform deposition by reactive sputtering, a reactive gas is introduced from the reactive gas introduction system 17. The sputtered particles adhere to the shield surface of the shield 40 on the inner wall, and a film is deposited.

At the position B of the substrate holder during presputtering, no labyrinth seal is formed. However, since an operation of retreating the substrate holder is unnecessary later at the time of operation of opening the substrate shutter 19, the shutter opening operation can be executed quickly. In addition, since the substrate 10 is already placed on the substrate placing surface of the substrate holder 7, a small amount of sputtered particles that have wrapped around poses no problem in many cases. However, if the small amount of sputtered particles that have wrapped around is problematic, the substrate shutter 19 is set at the position A during presputtering to ensure the characteristics of the semiconductor device. This allows to prevent the sputtered particles from wrapping around during presputtering and deposit a film having higher quality.

Figure 6F:
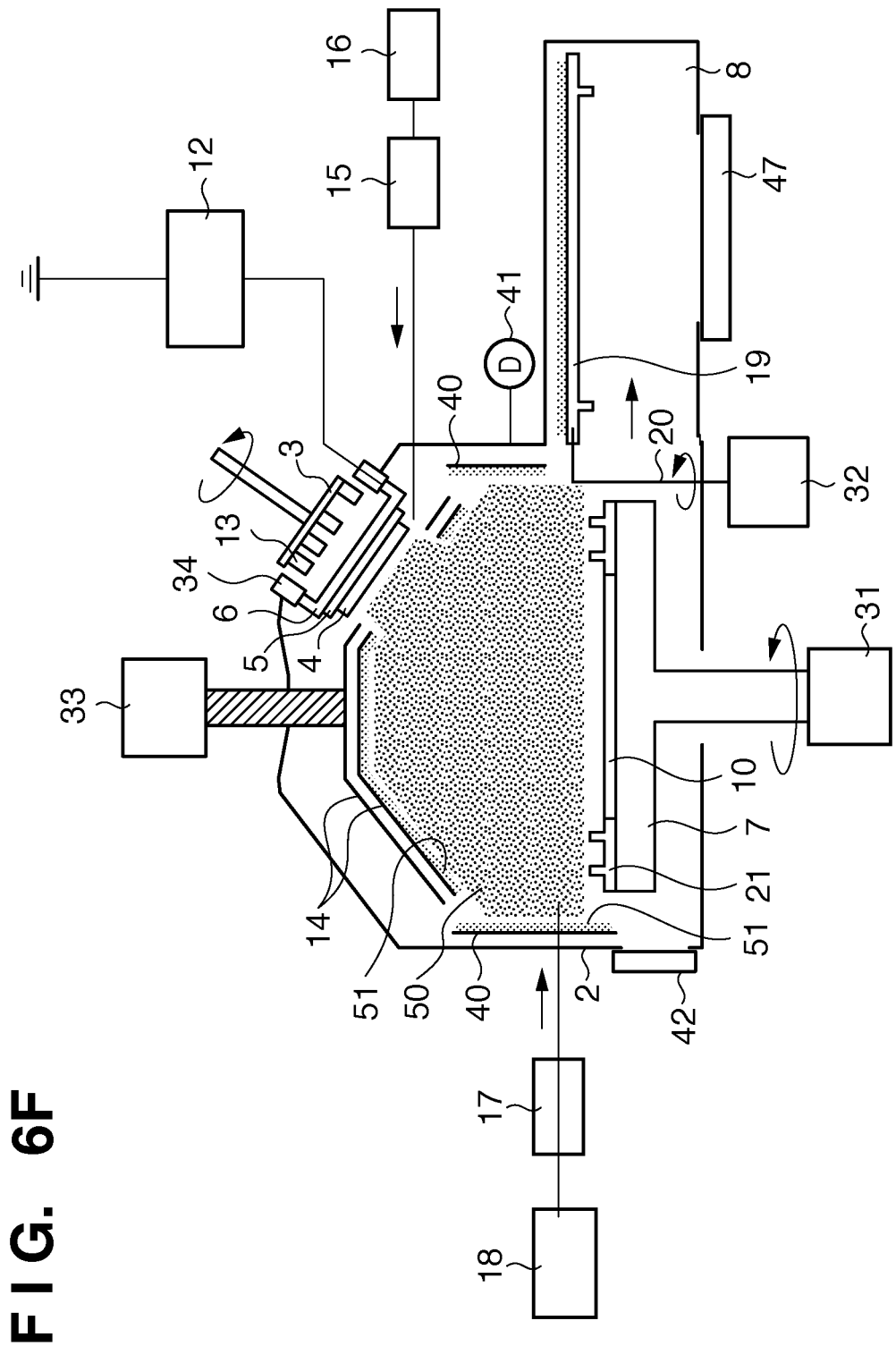
FIG. 6F is a view for explaining the operation of the deposition apparatus when performing a presputtering operation and deposition on a substrate.

After presputtering is performed for a necessary time, the main controller 100 causes the substrate shutter driving mechanism 32 to open the substrate shutter 19 and starts deposition on the substrate 10, as shown in FIG. 6F.

Figure 6G:
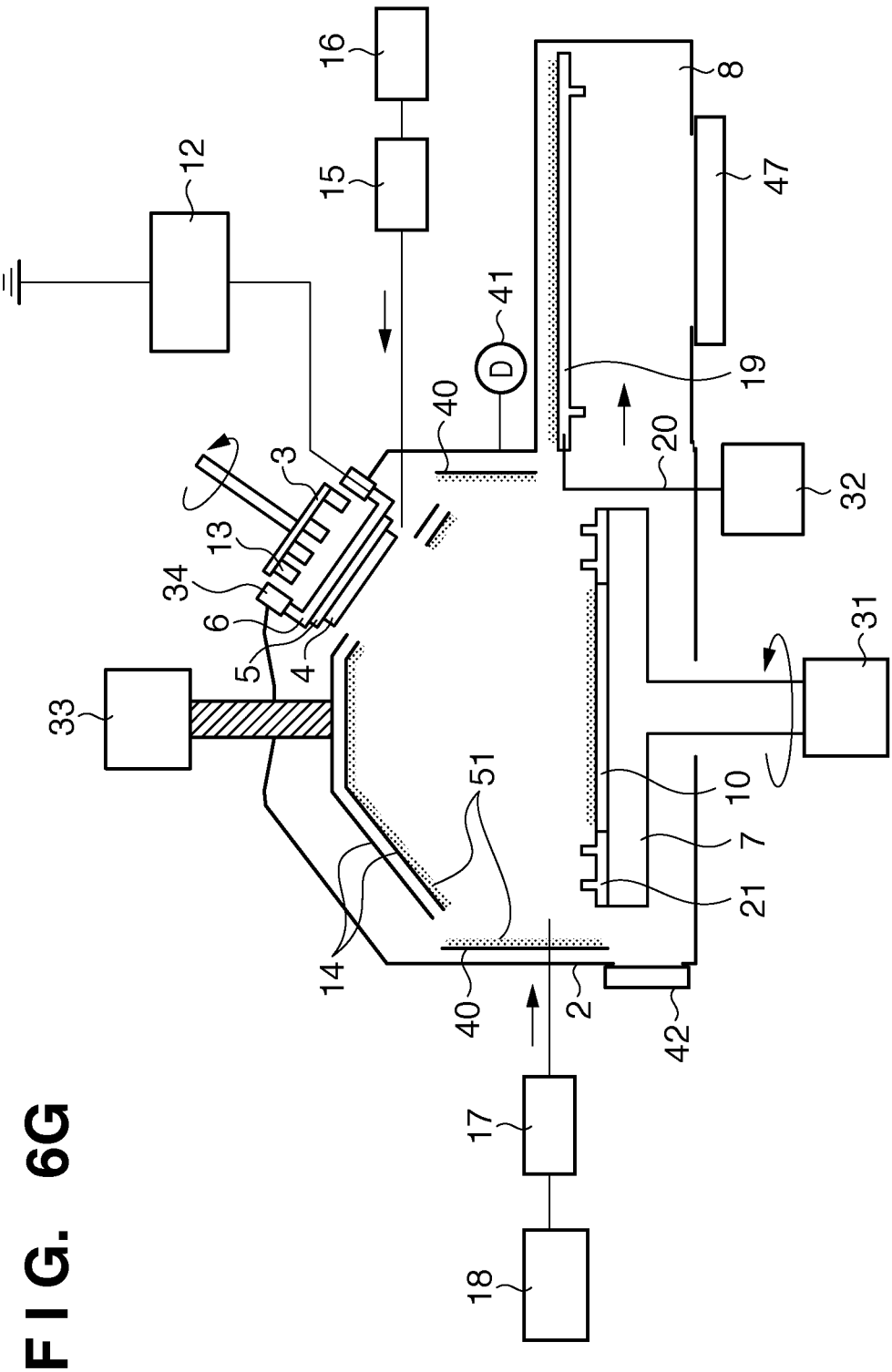
FIG. 6G is a view for explaining the operation of the deposition apparatus when performing a presputtering operation and deposition on a substrate.
Figure 6H:
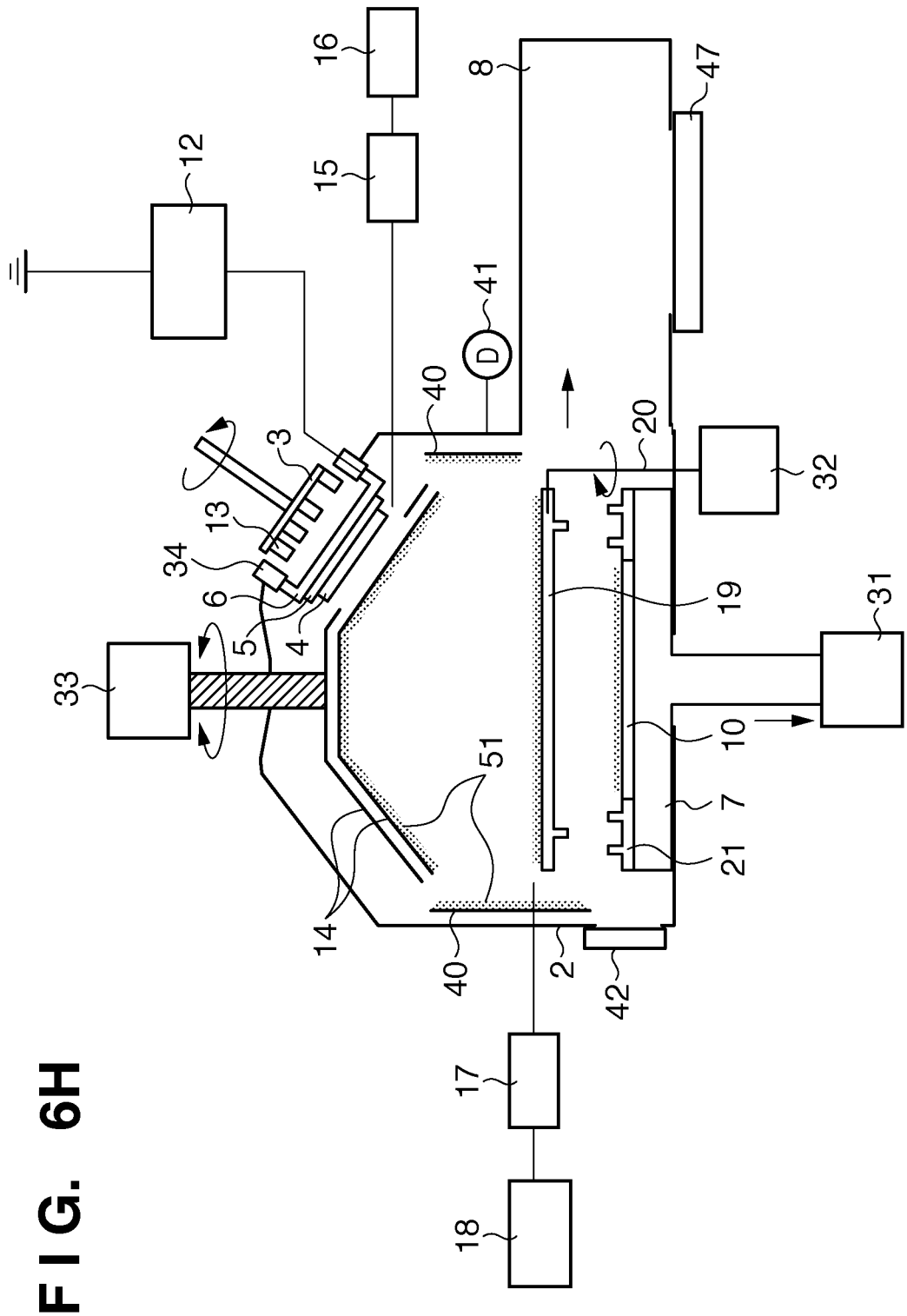
FIG. 6H is a view for explaining the operation of the deposition apparatus when performing a presputtering operation and deposition on a substrate.

After discharge is performed for a predetermined time, the main controller 100 stops power application to stop the discharge and also stops supply of the inert gas, as shown in FIG. 6G. If a reactive gas is being supplied, the main controller 100 stops supply of the reactive gas, too. The main controller 100 closes the substrate shutter 19 and the target shutter 14. The main controller 100 moves the substrate holder 7 from the position B to the position C, as shown in FIG. 6H.

Figure 6I:
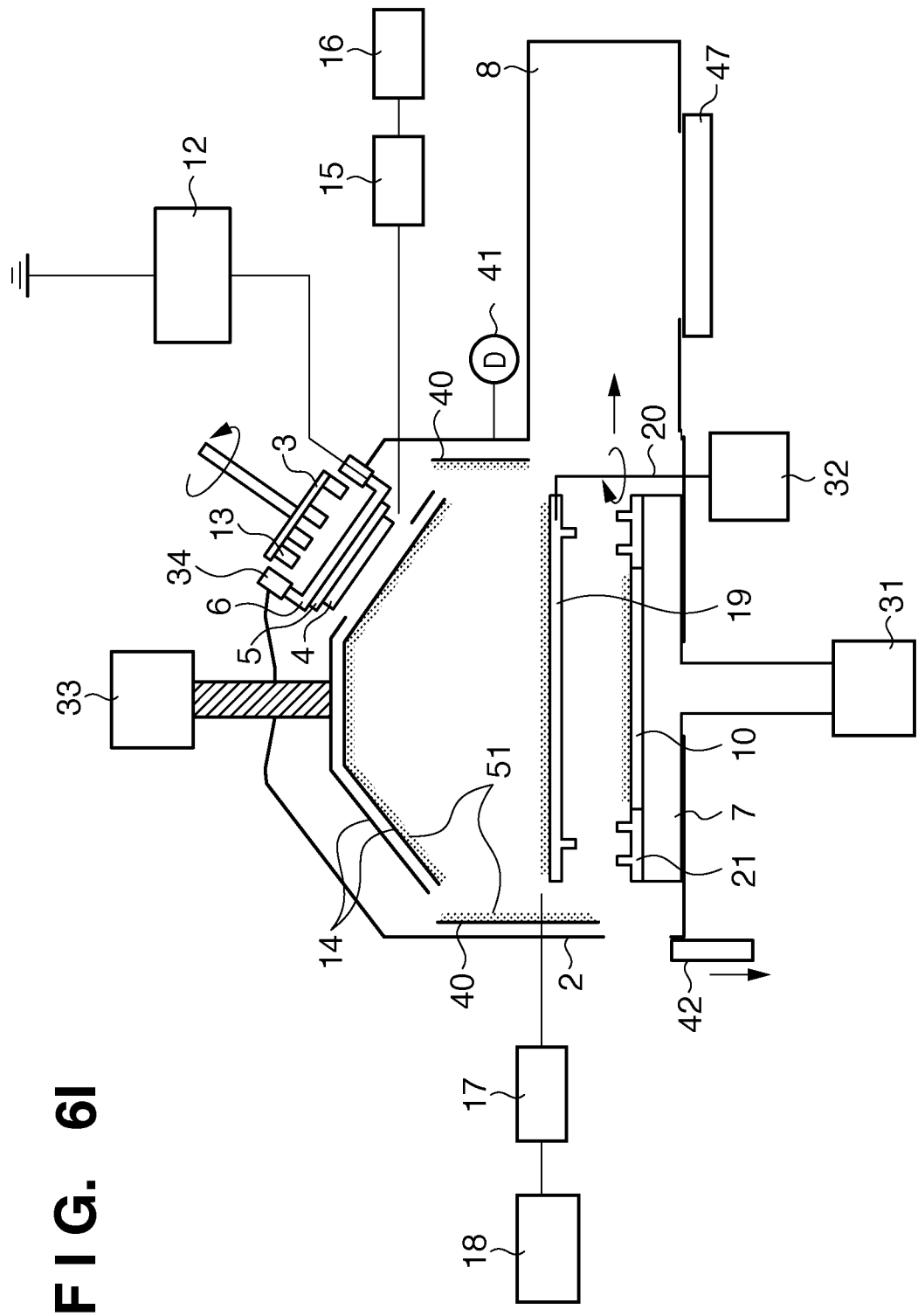
FIG. 6I is a view for explaining the operation of the deposition apparatus when performing a presputtering operation and deposition on a substrate.

As shown in FIG. 6I, the gate valve 42 of the chamber is opened, and the substrate is unloaded in an order reverse to that upon loading. Presputtering and deposition on the substrate are thus completed.

When the shutter mechanism is operated in accordance with the above-described procedure, it is possible to prevent the sputtered particles from entering the substrate and deposit a high-quality film.

According to the sputtering apparatus of this embodiment, it is possible to provide a sputtering apparatus that prevents sputtered particles from adhering to the substrate placing surface of the substrate holder when performing discharge for conditioning, presputtering, and target cleaning.

(First Modification)

Modifications of the labyrinth seal formed by the substrate shutter 19 and the substrate periphery cover ring 21 will be described with reference to FIGS. 7A to 7G.

Figure 7A:
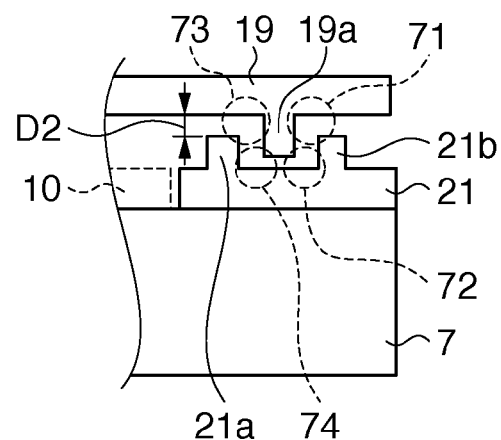
FIG. 7A is a view for explaining a modification of a labyrinth seal formed by the substrate shutter 19 and the substrate periphery cover ring 21.

FIG. 7A is an enlarged schematic view of the labyrinth seal formed by the substrate shutter 19 and the substrate periphery cover ring 21 in the apparatus shown in FIG. 1A. The labyrinth seal can be formed between the substrate periphery cover ring 21 and the substrate shutter 19 by the projection 19a of the substrate shutter provided to face the position between the projections 21a and 21b of the substrate periphery cover ring. When the substrate periphery cover ring 21 has two projections 21a and 21b, the seal space formed in the labyrinth shutter between the projections 21a and 21b and the projection 19a of the substrate shutter 19 has four bends indicated by broken line regions 71 to 74.

The vertical interval (for example, D2 in FIG. 7A) of the labyrinth seal can be changed by controlling the vertical movement of the substrate holder 7. In this case, the vertical movement of the substrate holder 7 is controlled by the main controller 100 so the substrate periphery cover ring 21 and the substrate shutter 19 do not come into contact. If the substrate periphery cover ring 21 and the substrate shutter 19 come into contact, sputtered particle wraparound to the substrate placing position of the substrate holder 7 does not occur. However, particles are undesirably generated at the contact portion between the substrate periphery cover ring 21 and the substrate shutter 19. This is because the particles degrade the quality of a film deposited on a process substrate to be transported and processed later and degrade the yield or characteristics of devices.

When opening/closing the substrate shutter 19, the main controller 100 operates the substrate holder driving mechanism 31 to move the substrate holder 7 down up to a position (position B or C) where the projections 21a and 21b of the substrate periphery cover ring 21 do not come into contact with the projection 19a of the substrate shutter 19. Such control performed by the main controller 100 not to make the projection of the substrate shutter 19 and the projections of the substrate periphery cover ring 21 collide (contact) also applies to the modifications of the labyrinth seal to be described below.

The labyrinth seal is formed by combining the projections and projections or grooves provided on the substrate shutter 19 and the substrate periphery cover ring 21. At least one of the substrate shutter 19 and the substrate periphery cover ring 21 needs to be movable in the vertical direction. In this embodiment, when the substrate holder 7 is driven in the vertical direction, the position of the substrate periphery cover ring 21 can move in the vertical direction.

The number of projections needs to be at least one on each of the substrate shutter 19 and the substrate periphery cover ring 21. One of the substrate shutter 19 and the substrate periphery cover ring 21 preferably has two or more projections from the viewpoint of preventing sputtered particle wraparound. FIG. 7A corresponding to FIG. 1A illustrates a case in which the substrate shutter 19 has one projection, and the substrate periphery cover ring 21 has two projections.

Figure 7B:
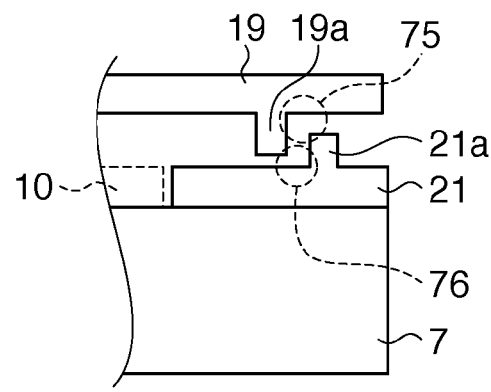
FIG. 7B is a view for explaining another modification of the labyrinth seal formed by the substrate shutter 19 and the substrate periphery cover ring 21.

FIG. 7B illustrates a case in which each of the substrate shutter 19 and the substrate periphery cover ring 21 has one projection. When the substrate periphery cover ring 21 has one projection 21a, the seal space formed in the labyrinth shutter between the projection 21a and the projection 19a of the substrate shutter 19 has two bends indicated by broken line regions 75 and 76.

Figure 7C:
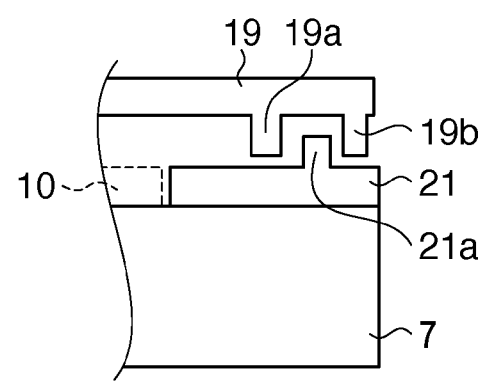
FIG. 7C is a view for explaining still another modification of the labyrinth seal formed by the substrate shutter 19 and the substrate periphery cover ring 21.
Figure 7D:
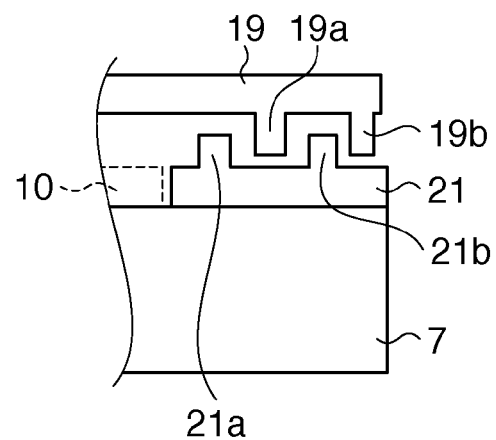
FIG. 7D is a view for explaining still another modification of the labyrinth seal formed by the substrate shutter 19 and the substrate periphery cover ring 21.

FIG. 7C illustrates a case in which the substrate shutter 19 has two projections 19a and 19b, and the substrate periphery cover ring 21 has one projection 21a. FIG. 7D illustrates a case in which the substrate shutter 19 has two projections 19a and 19b, and the substrate periphery cover ring 21 has two projections 21a and 21b.

Figure 7E:
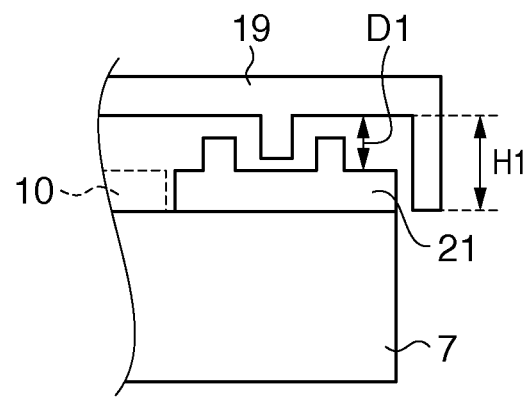
FIG. 7E is a view for explaining still another modification of the labyrinth seal formed by the substrate shutter 19 and the substrate periphery cover ring 21.

If a plurality of projections exist, for example, they may have different heights, as shown in FIG. 7E. Unless the substrate shutter 19 and the substrate periphery cover ring 21 come into contact, the projection height H1 or H2 may be larger than the distance D1 between the flat surface of the substrate shutter 19 and that of the substrate periphery cover ring 21. FIG. 7E shows an example in which the projection height H1 is larger than the distance D1.

FIG. 7E illustrates an example in which the projection provided on the substrate shutter 19 has a different length. However, the present invention is not limited to this example, and the projections of the substrate periphery cover ring 21 may have a different height.

The projections of the substrate shutter 19 and the substrate periphery cover ring 21 need not always have right-angled corners and bases. They may have, for example, a round shape for the sake of easier working and maintenance.

Figure 7F:
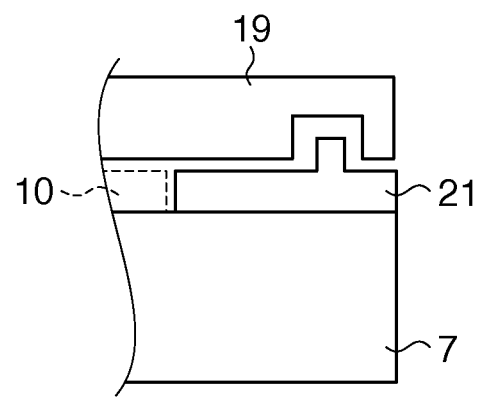
FIG. 7F is a view for explaining still another modification of the labyrinth seal formed by the substrate shutter 19 and the substrate periphery cover ring 21.

A structure as shown in FIG. 7F may be used, in which one of the substrate shutter 19 and the substrate periphery cover ring 21 has a groove formed in it, and the other has a projection so that the projection and the groove face each other to form a labyrinth seal.

Figure 7G:
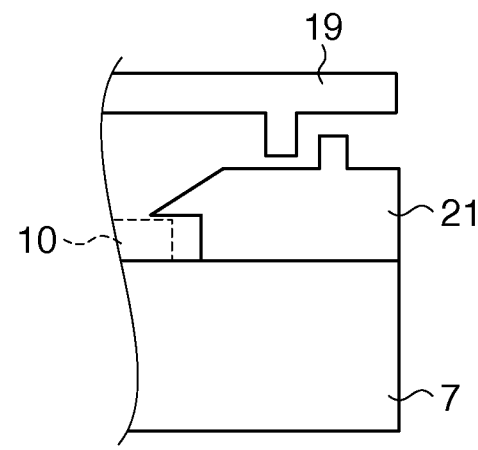
FIG. 7G is a view for explaining still another modification of the labyrinth seal formed by the substrate shutter 19 and the substrate periphery cover ring 21.

The substrate periphery cover ring 21 may have the function of a mask member (shadow ring) that prevents a film from being deposited on a portion (the edge (outer peripheral portion) of the substrate) other than the deposition surface of the substrate during deposition. To protect the edge (outer peripheral portion) of the substrate from sputtered particle adhesion, the substrate periphery cover ring 21 has, for example, a region overlapping the edge of the substrate, as shown in FIG. 7G. The substrate periphery cover ring may be configured to make the overlap portion contact the substrate to mechanically fix the substrate. Alternatively, if mechanical fixing is unnecessary, the substrate periphery cover ring 21 can be configured not to contact the substrate 10.

(Second Modification)

Figure 8:
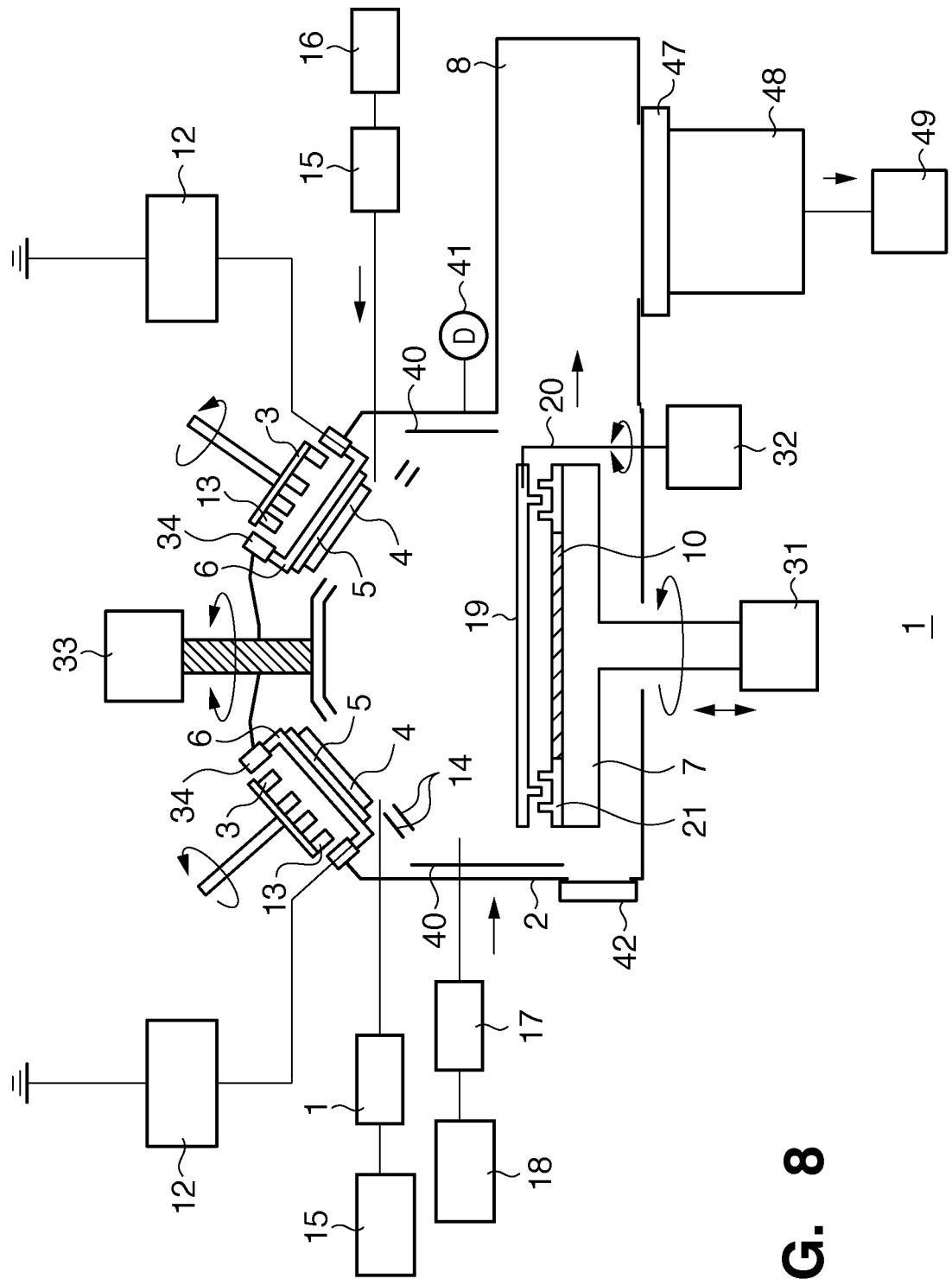
FIG. 8 is a schematic view showing a modification of the deposition apparatus according to the embodiment of the present invention.

In the above embodiment, an example in which a single target is used has been described. However, a sputtering apparatus using a plurality of targets as shown in FIG. 8 may be used. In this case, to prevent one target from being contaminated by adhesion of sputtered particles from the other target, a plurality of target shutters 14 need to be provided for the respective targets. This allows to perform the operation so as to prevent the targets from contaminating each other.

An electronic device manufacturing method according to the present invention will be described with reference to the following examples.

(Example 1)

A case in which the present invention is applied to preventing TiN from peeling from the chamber wall by periodically depositing a Ti film on the chamber wall at the time of TiN deposition. As the apparatus, the apparatus (FIG. 1A) described in the above embodiment was used. Ti was used as the target 4. As the projections of the substrate shutter 19 and the substrate periphery cover ring 21, those shown in FIG. 7A were used. In the state of FIG. 7A used in this embodiment, the substrate shutter 19 had one projection, and the substrate periphery cover ring 21 had two projections.

Conditioning discharge (presputtering) before of TiN deposition was performed for 1,200 sec under TiN deposition conditions to be described later. After that, a wafer prepared by forming a stacked film of $SiO_2$ (1.5 nm)/HfSiO (1.5 nm) on an Si substrate having a diameter of 300 mm was transported into the deposition chamber 1 and placed on the substrate holder 7. A TiN film having a thickness of 7 nm was deposited.

TiN deposition conditions at that time are as follows.
Ar gas as an inert gas was supplied at 20 sccm (sccm is a short to standard cc per minute and is used as the unit of the gas flow rate per minute converted into $cm^3$ under 1 atmospheric pressure at 0° C. as the standard state), $N_2$ gas as a reactive gas was supplied at 20 sccm, the pressure was set to 0.04 Pa, the power was set to 700 W, and the time was set to 240 sec.

The wafer was unloaded. Similar deposition was performed for 300 wafers. The wafers were unloaded, and the processing was ended.

Conditioning processing was performed next. In this example, the substrate shutter 19 had one projection having a projection height H1 of 10 mm. The substrate periphery cover ring 21 had two projections each having a projection height H2 of 10 mm. A distance D between the flat portions of the substrate shutter 19 and the substrate periphery cover ring 21, except the projections, was 15 mm. The substrate holder 7 was arranged in the state at the position A shown in FIG. 4A described above. Ar gas was supplied at 50 sccm, the pressure was set to 0.04 Pa, and discharge was started at a power of 1,000 W. After that, the target shutter 14 was opened, and conditioning discharge was performed for 2,400 sec while keeping the substrate shutter 19 closed.

Normally, no substrate is placed on the substrate holder 7 at the time of conditioning. In this example, however, for an experiment, a 300-mm Si bare substrate was placed on the substrate placing surface of the substrate holder 7, and discharge was then performed.

After the end of discharge, the 300-mm Si bare substrate placed on the substrate holder 7 was extracted. When a 26 to 34-mm portion from the substrate edge was analyzed using a total-reflection X-ray fluorescence analyzer TXRF: total-reflection X-ray fluorescence (TREX630IIIX available from Technos), the detected Ti amount was equal to or smaller than the detection limit.

(Example 2)

To check the effect of a labyrinth seal having a labyrinth path shape different from that of Example 1, an experiment was conducted using the same apparatus and conditions as in Example 1 except that the substrate periphery cover ring 21 used had a different number of projections, as shown in FIG. 7B. The substrate periphery cover ring 21 (FIG. 7B) used in this example had one projection, and the substrate shutter 19 had one projection. When the experiment was conducted under the same conditions as in Example 1, the detected Ti amount was $2 \times 10^{10}$ atms/cm$^2$.

(Comparative Example 1)

For comparison, an experiment of conditioning discharge was conducted under the same conditions as described above except using an apparatus in which the substrate periphery cover ring 21 of the substrate holder 7 and the substrate shutter 19 had no projection, and no labyrinth seal was formed. The experiment was conducted by setting the distance D between the flat portions of the substrate shutter 19 and the substrate periphery cover ring 21 to the same value as in Examples 1 and 2. As a result, a visually recognizable Ti film was formed on the outer peripheral portion of the substrate. The formed Ti film was thick and could not be measured by a TXRF. The film thickness measured by observing the section by a TEM (Transmission Electron Microscope) was about 5 nm. Note that the Ti amount in the Ti film having the thickness of 5 nm is calculated as about $3 \times 10^{16}$ atms/cm$^2$ by setting the concentration of Ti to 4.5. It was therefore confirmed that the amount of sputtered particles that have wrapped around to the substrate placing surface was much larger in this comparative example without a labyrinth seal than in Example 1 or 2 in which a labyrinth seal was formed.

Examples 1 and 2 and the comparative example are summarized in Table 1.

Note that the Ti amount (*) of the comparative example represents the converted value from the film thickness.

TABLE 1

| | Number of projections of substrate shutter | Number of projections of substrate periphery cover ring | Ti amount (atms/cm$^2$) |
|---|---|---|---|
| Example 1 | 1 | 2 | equal to or smaller than detection limit |
| Example 2 | 1 | 1 | $2 \times 10^{10}$ |
| Comparative example | 0 | 0 | $3 \times 10^{16}$* |

In Examples 1 and 2 in which the labyrinth seal exists, the Ti amount was conspicuously smaller than in the comparative example without the labyrinth seal. In Example 1 in which the substrate periphery cover ring 21 had two projections (the seal space had four bends), the detected Ti amount was smaller than in Example 2 in which the substrate periphery cover ring 21 had one projection (the seal space had two bends). When two projections existed on one side, that is, the labyrinth seal space had four bends, a more conspicuous effect of preventing wraparound at the atomic level was obtained than in the case in which one projection existed on each side, that is, the labyrinth seal space had only two bends. Note that the confirmation was similarly done for FIGS. 7C, 7D, 7E, and 7F, the detected Ti amount was equal to or smaller than the detection limit, as in Example 1. In FIGS. 7C, 7D, 7E, and 7F, the labyrinth seal has four or more bends.

That is, when the labyrinth seal space has four or more bends, an effect equivalent to or more than that of Example 1 is assumed to be obtained.

(Example 3)

Figure 9:
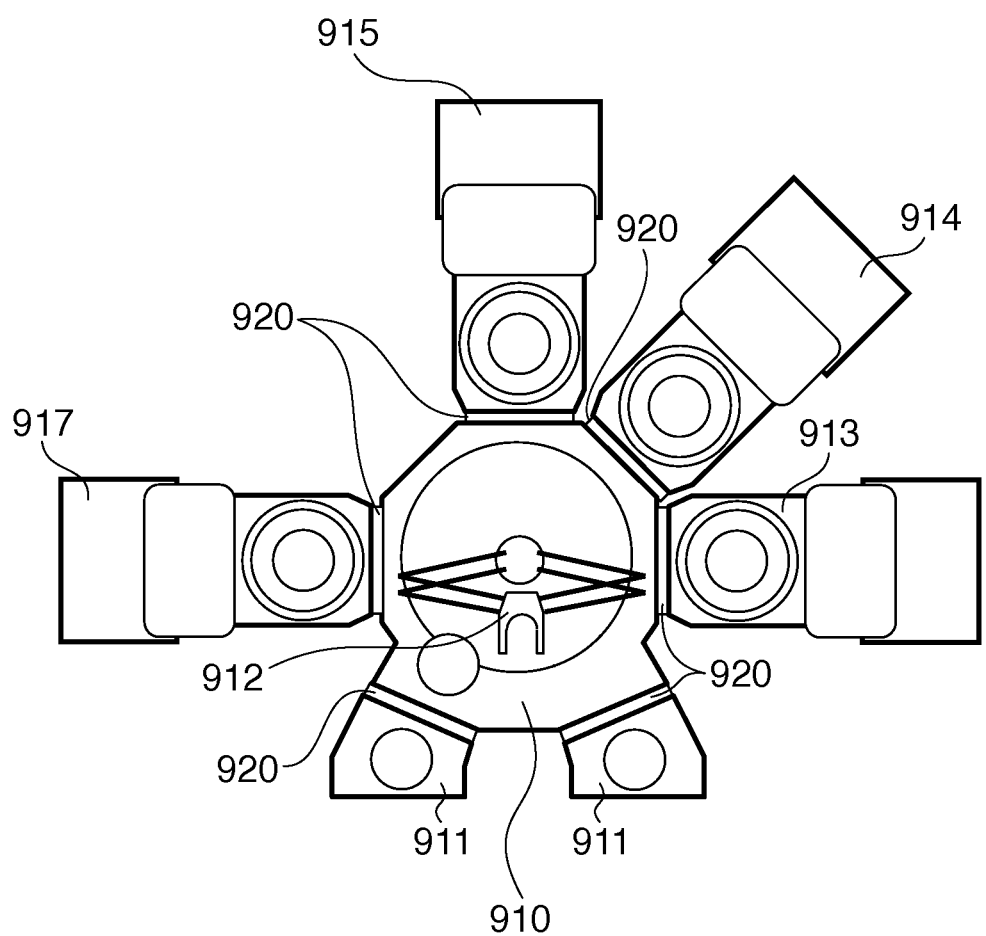
FIG. 9 is a view showing the schematic arrangement of a stacked film deposition apparatus for a flash memory, which is an example of a vacuum thin deposition apparatus including the deposition apparatus according to the embodiment of the present invention.

FIG. 9 is a view showing the schematic arrangement of a stacked film deposition apparatus for a flash memory (to be also simply referred to as a "stacked film deposition apparatus" hereinafter), which is an example of a vacuum thin deposition apparatus including the deposition apparatus 1 according to the embodiment of the present invention. The stacked film deposition apparatus shown in FIG. 9 includes a vacuum transport chamber 910 incorporating a vacuum transport robot 912. Load lock chambers 911, a substrate heating chamber 913, a first PVD (sputtering) chamber 914, a second PVD (sputtering) chamber 915, and a substrate cooling chamber 917 are connected to the vacuum transport chamber 910 via gate valves 920.

The operation of the stacked film deposition apparatus shown in FIG. 9 will be described next. First, a target process substrate (silicon wafer) is set in the load lock chamber 911 configured to load/upload a target process substrate into/from the vacuum transport chamber 910, and evacuation is performed to a pressure of $1 \times 10^{-4}$ Pa or less. After that, using the vacuum transport robot 912, the target process substrate is loaded into the vacuum transport chamber 910 where the degree of vacuum is maintained at $1 \times 10^{-6}$ Pa or less and then transported to a desired vacuum processing chamber.

In this embodiment, the target process substrate is first transported to the substrate heating chamber 913 and heated to 400° C. Next, the target process substrate is transported to the first PVD (sputtering) chamber 914, and a thin Al$_2$O$_3$ film having a thickness of 15 nm is deposited on the target process substrate. The target process substrate is then transported to the second PVD (sputtering) chamber 915, and a TiN film having a thickness of 20 nm is deposited on it. Finally, the target process substrate is transported to the substrate cooling chamber 917 and cooled to room temperature. After all the processes have been ended, the target process substrate is returned to the load lock chamber 911. Dry nitrogen gas is introduced up to the atmospheric pressure, and then, the target process substrate is extracted from the load lock chamber 911.

In the stacked film deposition apparatus of this embodiment, the degree of vacuum in the vacuum processing chamber is $1\times10^{-6}$ Pa or less. In this embodiment, magnetron sputtering is used to deposit the $Al_2O_3$ film and the TiN film.

Figure 10:
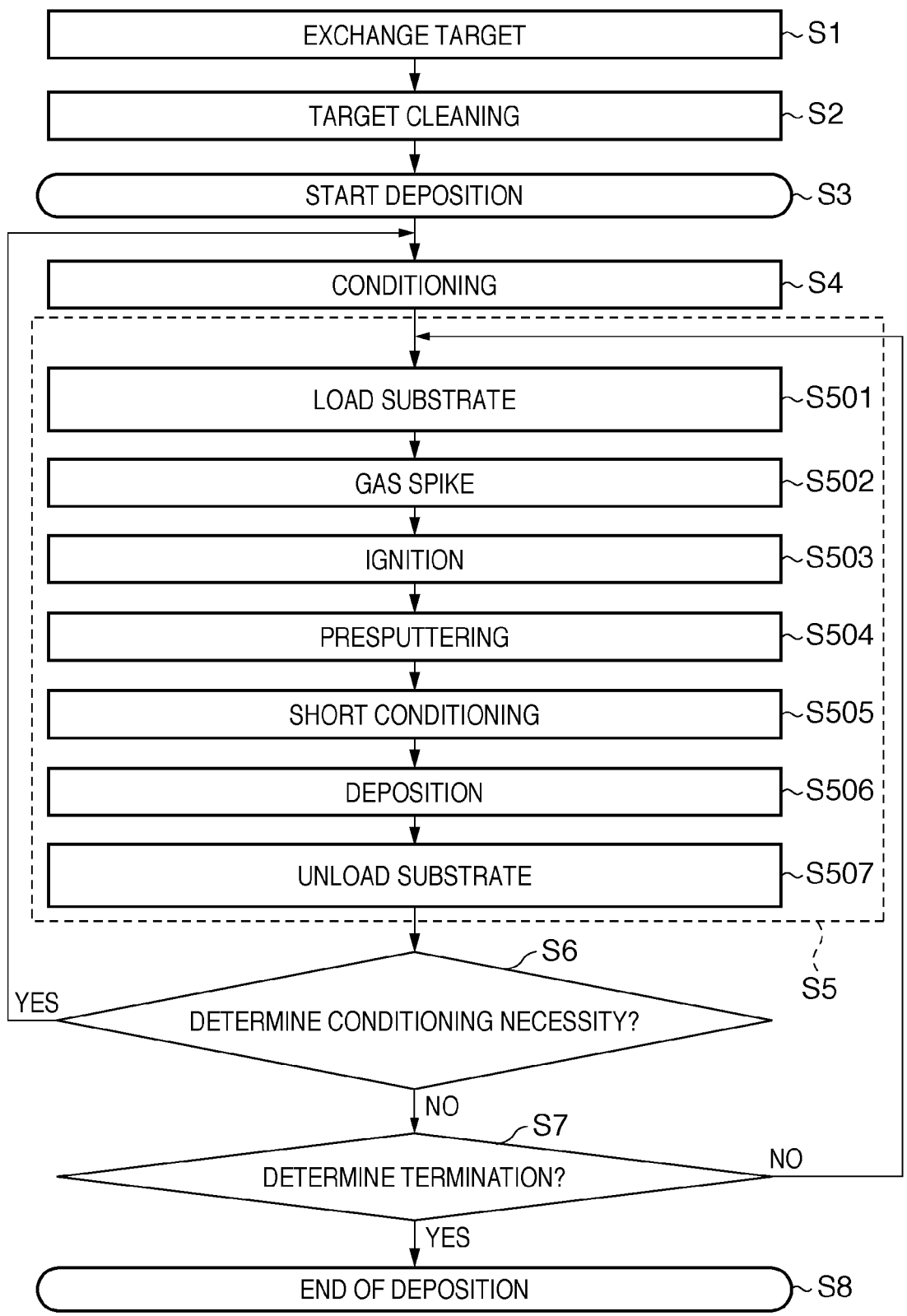
FIG. 10 is a flowchart illustrating a procedure of performing processing of an electronic device product using the deposition apparatus according to the embodiment of the present invention.

FIG. 10 is a flowchart illustrating an electronic device product processing procedure concerning an electronic device manufacturing method using the deposition apparatus 1 according to the embodiment of the present invention. Note that an example will be described here in which Ti is used as the target 4 set in the deposition apparatus 1, argon is used as an inert gas, and nitrogen is used as a reactive gas.

In step S1, after the target and the shield have been exchanged, the vacuum container 2 is exhausted and controlled to a predetermined pressure. When the predetermined pressure is obtained, target cleaning starts in step S2 while keeping the target shutter 14 and the substrate shutter 19 closed. Target cleaning indicates sputtering to be performed to remove an impurity or an oxide adhered to the surface of the target. In the target cleaning, the substrate holder is set to such a height that the substrate shutter 19 and the substrate periphery cover ring 21 form a labyrinth seal. This setting enables to prevent sputtered particles from adhering to the substrate placing surface of the substrate holder. Note that when the target cleaning may be executed in a state in which a substrate is placed on the substrate holder.

In step S3, the main controller 100 starts the deposition operation in accordance with a deposition start instruction input from an input device (not shown) to the main controller 100.

When the deposition start instruction is input in step 3, conditioning is performed in step S4. Conditioning indicates processing of performing discharge, sputtering the target, and adhering sputtered particles to the inner wall of the chamber and the like to stabilize the deposition characteristics.

The conditioning will be explained in more detail. FIG. 11 is a table showing a procedure of performing conditioning using the sputtering deposition apparatus 1. More specifically, FIG. 11 shows the step number, the time (set time) of each process, the position (opening/closing) of the target shutter, the position (opening/closing) of the substrate shutter, the target application power, the Ar gas flow rate, and the nitrogen gas flow rate. These procedures are stored in the storage device 63 and continuously executed by the main controller 100.

The procedure of deposition will be explained with reference to FIG. 11. First, gas spike is performed (step S1101). In this step, the pressure in the chamber is raised to set a state to facilitate the start of discharge in the next plasma ignition step. As the conditions, the target shutter 14 and the substrate shutter 19 are closed, no nitrogen gas is introduced, and the argon gas flow rate is set to 400 sccm. The argon gas flow rate is preferably 100 sccm or more to facilitate ignition in the next plasma ignition step.

The plasma ignition step is performed (step S1102). While holding the shutter positions and the gas conditions, a DC power of 1,000 W is applied to the Ti target to generate plasma (plasma ignition). Using the gas conditions allows to prevent a plasma generation failure that readily occurs at a low pressure.

Presputtering (step S1103) is performed. In the presputtering, the argon gas condition is changed to 100 sccm while maintaining the power (target application power) applied to the target. With this procedure, the discharge can be maintained without losing the plasma.

Conditioning 1 (step S1104) is performed. In the conditioning 1, the target shutter 14 is opened while maintaining the target application power and the gas flow rate conditions and keeping the substrate shutter 19 closed. This makes it possible to adhere sputtered particles from the Ti target to the chamber inner wall including the shield inner wall and thus cover the shield inner wall with a low-stress film.

Since the sputtered film can be prevented from peeling from the shield, a peeled film can be prevented from scattering in the chamber and dropping on a device to degrade the characteristics of the product.

Gas spike (step S1105) is performed again. In the gas spike step, power application to the target is stopped, the argon gas flow rate is set to 200 sccm, and the nitrogen gas flow rate is set to 10 sccm. The argon gas flow rate is preferably higher than that in the conditioning 2 step (step S1108) to be described later, for example, 100 sccm or more to facilitate ignition in the next plasma ignition step. In addition, since a nitride film is deposited in the conditioning 2 step (step S1108) to be described later by reactive sputtering using nitrogen gas introduced, introducing the nitrogen gas already in the gas spike step has the effect of preventing an abrupt change in the gas flow rate.

The plasma ignition step is performed (step S1106). While holding the shutter positions and the gas flow rate conditions, a DC power of 750 W is applied to the Ti target to generate plasma (plasma ignition). Using the gas conditions allows to prevent a plasma generation failure that readily occurs at a low pressure.

Presputtering (step S1107) is performed. In the presputtering, the argon gas flow rate condition is changed to 10 sccm, and the nitrogen gas flow rate condition is changed to 10 sccm while maintaining the target application power. With this procedure, the discharge can be maintained without losing the plasma.

Conditioning 2 (step S1108) is performed. In the conditioning 2, the target shutter 14 is opened while maintaining the target application power and the gas flow rate conditions and keeping the substrate shutter 19 closed. Since the sputtered particles from the Ti target and nitrogen that is a reactive gas react, and a nitride film adheres to the chamber inner wall including the shield inner wall, an abrupt change in the gas state in the chamber can be suppressed when advancing to the next substrate deposition step. When an abrupt change in the gas state in the chamber is suppressed, deposition in the next substrate deposition step can be performed in a stable state from the beginning. It is therefore possible to obtain the effect of greatly improving the manufacturing stability in the device manufacturing.

The time necessary for each of the above-described procedures is set to an optimum value. In this embodiment, the time is set to 0.1 sec for the first gas spike (step S1101), 2 sec for plasma ignition (step S1102), 5 sec for presputtering (step S1103), 240 sec for conditioning 1 (step S1104), 5 sec for the second gas spike (step S1105), 2 sec for the second plasma ignition (step S1106), 5 sec for the second presputtering, and 180 sec for conditioning 2 (step S1108).

Note that the second gas spike step (step S1105) and the subsequent plasma ignition step (step S1106) and presputtering step (step S1107) can be omitted. The omission is preferable from the viewpoint of shortening the conditioning time. However, when the conditioning 2 step (step S1108) by adding nitrogen gas is performed next to the conditioning 1 step (step S1104) that is argon gas discharge, the plasma characteristics largely change while continuing the discharge.

The amount of particles may increase due to the transition state. In such a case, these steps (steps S1105, S1106, and S1107) including temporarily stopping the discharge and replacing the gases are inserted between the conditioning 1 step (step S1104) and the conditioning 2 step (step S1108), thereby further suppressing an abrupt variation in the plasma characteristics during conditioning. This allows to reduce the risk of particle generation.

Note that the conditioning 2 (step S1108) that is reactive sputtering preferably uses almost the same conditions as the conditions of deposition on the substrate to be described later. When the conditions of the conditioning 2 (step S1108) are almost the same as the conditions of deposition on the substrate in the product manufacturing step, deposition on the substrate in the product manufacturing step can be done more stably at high reproducibility.

Referring back to FIG. 10, after the conditioning (step S4), step S5 including deposition processing on a substrate is performed. The procedure of deposition processing included in step S5 will be explained with reference to FIG. 10.

First, a substrate is loaded (step S501). In the substrate loading step (step S501), the gate valve 42 is opened. The substrate 10 is loaded into the vacuum container 2 by a substrate transport robot (not shown) and a lift mechanism (not shown) and placed on the substrate placing surface of the substrate holder 7. The substrate holder 7 moves up to the deposition position while keeping the substrate placed on it.

Gas spike is performed (step S502). In the gas spike step (step S502), the target shutter 14 and the substrate shutter 19 are closed, argon gas is introduced at, for example, 200 sccm, and nitrogen gas is introduced at 10 sccm. The amount of argon gas is preferably larger than the amount of argon gas flow introduced in the deposition step (step S506) to be described later from the viewpoint of facilitating the start of discharge. The time necessary for the gas spike step (step S502) is, for example, about 0.1 sec because it is only necessary to ensure the pressure required in the next ignition step (step S503).

Plasma ignition is performed next (step S503). In the plasma ignition step (step S503), while keeping the target shutter 14 and the substrate shutter 19 closed and maintaining the argon gas and nitrogen gas flow rates to the same conditions in the gas spike step (step S502), a direct current (DC) power of, for example, 750 W is applied to the target 4 to generate discharge plasma near the sputtering surface of the target. The time necessary for the plasma ignition step (step S503) is, for example, 2 sec because it need only be a time to ignite plasma.

Presputtering is performed (step S504). In the presputtering step (step S504), the target shutter 14 and the substrate shutter 19 are kept closed, the argon gas flow rate is reduced to, for example, 10 sccm, and the nitrogen gas flow rate is set to 10 sccm. At this time, the direct current (DC) power to the target is, for example, 750 W, and the discharge is maintained. The time necessary for the presputtering step (step S504) is, for example, 5 sec because it need only be a time to prepare for the next short conditioning.

Short conditioning is performed (step S505). In the short conditioning step (step S505), the target shutter 14 is opened to set the open state. The substrate shutter 19 maintains the closed state, the argon gas flow rate is maintained at 10 sccm, and the nitrogen gas flow rate is maintained at 10 sccm. At this time, the direct current (DC) power to the target is, for example, 750 W, and the discharge is maintained. In the short conditioning, a titanium nitride film is deposited on the shield inner wall and the like, providing an effect for deposition in a stable atmosphere in the next substrate deposition step (step S506). To enhance the effect, deposition is preferably performed under almost the same conditions as the discharge conditions in the next substrate deposition step (step S506). The time necessary for the short conditioning step (step S505) can be shorter than the times of the above-described conditioning 1 (step S1104) and conditioning 2 (step S1108), for example, 5 to 30 sec because the atmosphere is prepared in the preceding conditioning (step S4).

Next, the discharge is maintained while keeping the same conditions of the argon gas, nitrogen gas, and the DC power as in the short conditioning step (step S505). While keeping the target shutter 14 in the closed state, the substrate shutter 19 is opened, and deposition on the substrate starts (step S506). That is, as the conditions of deposition on the substrate 10, the argon gas flow rate is 10 sccm, the nitrogen gas flow rate is 10 sccm, and the DC power applied to the target is 750 W.

After the power to the target 4 is stopped to end deposition S506 on the substrate, substrate unloading 507 is performed. In the substrate unloading 507, the substrate holder 7 moves down, the gate valve 42 is opened, and the substrate 10 is unloaded by the substrate transport robot (not shown) and the lift mechanism (not shown).

Next, the main controller 100 determines whether conditioning is necessary (step S6). In the conditioning necessity determination step (step S6), the main controller 100 determines based on a determination condition stored in the storage device 63 whether conditioning is necessary. Upon determining that conditioning is necessary, the process returns to step S4 to perform conditioning again (step S4). On the other hand, if the main controller 100 has determined in step S6 that conditioning is unnecessary, the process advances to termination determination in step S7. In step S7, the main controller 100 performs the determination based on whether a termination signal has been input to it or whether a process substrate to be supplied to the apparatus exists. Upon determining not to terminate (NO in step S7), the process returns to step S501 to perform substrate loading (step S501) to substrate unloading (step S507) via deposition (step S506). The deposition processing on a product substrate is thus continued to form a predetermined number of films, for example, several hundred films.

An example will be described in which it is determined to start conditioning in the conditioning necessity determination step (step S6). After continuous processing, a standby time may occur due to a product waiting time or the like. If a standby time that makes conditioning necessary has occurred based on the determination condition stored in the storage device 63, the main controller 100 determines that conditioning is necessary, and executes the conditioning in step S4 again. By this conditioning, the upper surface of the high-stress film of TiN or the like adhered to the shield inner surface can be covered with a low-stress film of Ti or the like. When TiN continuously adheres to the shield, film peeling occurs, and particles are generated due to the high stress of the TiN film and the weak adhesion to the shield. To prevent the film peeling, Ti sputtering is performed.

A Ti film has a strong adhesion to the shield or the TiN film and has the effect of preventing peeling of the TiN film (wall pasting effect). In this case, sputtering on the entire shield can effectively be done using the substrate shutter. In the sputtering deposition apparatus 1 according to the embodiment of the present invention, a labyrinth seal is formed by the substrate shutter 19 and the substrate periphery cover ring 21. It is therefore possible to perform conditioning without depositing a sputtered film on the substrate placing surface of the substrate holder.

After the conditioning, the deposition processing in step S5 (steps S501 to S507) is performed again.

After the conditioning is performed in the above-described way, the procedure of product processing is repeated until the end of life of the target. After that, maintenance is carried out. After the shield and the target have been exchanged, the processing is repeated from the target cleaning at the initial stage.

With the above-described procedure, an electronic device can be manufactured while preventing a film adhered to the shield from peeling without adhering a sputtered film to the substrate placing surface of the substrate holder. In this embodiment, an example has been described in which maintenance is carried out at the end of life of the target. The same operation as described above is applied even to maintenance for shield exchange. An example has been described above in which conditioning starts when a standby time has occurred. However, the conditioning start condition (condition of conditioning necessity determination) is not limited to the above-described example.

FIG. 12 is a table for exemplarily explaining conditioning start conditions (conditions of conditioning necessity determination). The determination conditions to start conditioning are the total number of processed substrates, the total number of processed lots, the total thickness of deposited films, the electric energy applied to the target, the electric energy applied to the target to perform deposition using an exchanged shield, the standby time, and a change of a deposition condition caused by, for example, a change of an electronic device as a process target.

The conditioning start timing can be set to a point after the end of processing of a lot (a bundle of substrates conveniently set for manufacturing process management, and one lot normally includes 25 substrates). If there are a plurality of lots (process lots) to be processed, the determination condition is the total number of process lots. The conditioning start timing can be set to a point after the end of processing of all lots (conditioning start conditions 1, 3, 5, 7, 9, and 11). Alternatively, even during processing of a lot, if one of the above-described determination conditions other than the conditions concerning the lot is satisfied, an interrupt can occur during the processing to start conditioning (conditioning start conditions 2, 4, 6, 8, 10, and 12).

A method 1201 of performing determination based on the total number of processed substrates has the advantage of making the conditioning interval constant even when the number of substrates included in a lot varies. A method 1202 of performing determination based on the total number of process lots has the advantage of predicting the time to perform conditioning when the process is managed based on the number of lots.

A method 1203 of performing determination based on the thickness of films deposited by the deposition apparatus has the advantage of executing conditioning at an appropriate timing when film peeling from the shield depends on an increase in the film thickness. A method 1204 of performing determination based on the accumulated power to the target has the advantage of executing conditioning at an appropriate timing when the target surface changes upon deposition processing. A method 1205 of performing determination based on the accumulated power per shield has the advantage of executing conditioning at an appropriate timing even when the period of shield exchange and that of target exchange are shifted. A method 1206 of performing determination based on the standby time has the effect of stabilizing the deposition characteristics in an excellent state if the residual gas concentration or temperature in the deposition chamber may change to degrade the deposition characteristics during the standby time. A method 1207 using a change of a condition of deposition on a substrate (product manufacturing condition) as a determination condition has the effect of stably depositing a film on a substrate even when the deposition conditions have changed. When a deposition condition changes, the state of the shield inner wall surface or target surface changes. These changes lead to a variation in the gas composition or a variation in electrical characteristics caused by, for example, the gettering performance of the shield inner wall surface or target surface. This causes a variation in the characteristics of deposition on a substrate within a lot. The method 1207 using a change of a condition of deposition on a substrate (product manufacturing condition) as a determination condition has the effect of suppressing such defects.

The methods of executing conditioning after lot processing have the effect of preventing an interrupt of lot processing (conditioning start conditions 1, 3, 5, 7, 9, and 11). The methods of interrupting lot processing to perform conditioning have the advantage of executing conditioning at an accurate timing (conditioning start conditions 2, 4, 6, 8, 10, and 12). When a change of a deposition condition is used as the determination condition, conditioning is executed before lot processing (conditioning start condition 13).

FIG. 13 is a graph showing a result obtained by measuring the number of particles adhered to a substrate once a day when processing shown in FIG. 10 was executed using the sputtering deposition apparatus 1 according to the embodiment of the present invention. The abscissa represents the day of measurement, and the ordinate represents the number of particles having a size of 0.09 μm or more and observed on a silicon substrate having a diameter of 300 mm. The number of particles was measured using surface inspection apparatus "SP2" (trade name) available from KLA-Tencor. This data indicates that the very excellent number of particles, that is, 10 particles per substrate could be maintained for a relatively long time of 16 days.

The present invention is not limited to the above embodiments and various changes and modifications can be made within the spirit and scope of the present invention. Therefore, to apprise the public of the scope of the present invention, the following claims are made.

The invention claimed is:

1. An electronic device manufacturing method using a sputtering apparatus including:
    a target holder provided in a vacuum container and configured to hold a target to be used for deposition on a substrate;
    a substrate holder configured to hold the substrate;
    a first shield member arranged near the substrate holder and configured to set one of a closed state in which the substrate holder is shielded from the target holder and an open state in which the substrate holder is opened to the target holder;
    first opening/closing driving means for opening/closing-driving the first shield member to one of the open state and the closed state;
    a second shield member having a ring shape and installed on a surface of the substrate holder at an outer peripheral portion of the substrate; and
    driving means for moving the substrate holder to move the substrate holder with the second shield member being installed close to or away from the first shield member in the closed state,
    the first shield member having at least one first projecting portion extending in a direction of the second shield member and having a ring shape, and the second shield member having at least one second projecting portion extending in a direction of the first shield member and having a ring shape, the method comprising:

a first step of causing the driving means to move the substrate holder close to the first shield member and locating the first projecting portion and the second projecting portion at a position to engage with each other in a noncontact state;

a second step of, after the first step, sputtering the target while maintaining the first projecting portion and the second projecting portion at the position to engage with each other in the noncontact state; and a third step of, after the second step, causing the first opening/closing driving means to set the first shield member in the open state and sputtering the target to perform deposition on the substrate.

2. The electronic device manufacturing method according to claim 1, wherein the sputtering apparatus further includes:

a target shutter arranged near the target holder and configured to set one of a closed state in which the substrate holder is shielded from the target holder and an open state in which the substrate holder is opened to the target holder; and target shutter driving means for opening/closing-driving the target shutter to one of the open state and the closed state, and the second step further comprises a target cleaning step of causing the target shutter driving means to set the target shutter in the closed state and sputtering the target.

3. The electronic device manufacturing method according to claim 1, wherein the sputtering apparatus further includes:

a target shutter arranged near the target holder and configured to set one of a closed state in which the substrate holder is shielded from the target holder and an open state in which the substrate holder is opened to the target holder; and target shutter driving means for opening/closing-driving the target shutter to one of the open state and the closed state, and the second step further comprises a conditioning step of causing the target shutter driving means to set the target shutter in the open state and sputtering the target.

4. An electronic device manufacturing method using a sputtering apparatus including:

a target holder provided in a vacuum container and configured to hold a target to be used for deposition on a substrate;

a substrate holder configured to hold the substrate;

a first shield member arranged near the substrate holder and configured to set one of a closed state in which the substrate holder is shielded from the target holder and an open state in which the substrate holder is opened to the target holder;

first opening/closing driving means for opening/closing-driving the first shield member to one of the open state and the closed state;

a second shield member having a ring shape and installed on a surface of the substrate holder at an outer peripheral portion of the substrate; and driving means for moving the first shield member to move the first shield member in the closed state close to or away from the substrate holder with the second shield member being installed, the first shield member having at least one first projecting portion extending in a direction of the second shield member and having a ring shape, and the second shield member having at least one second projecting portion extending in a direction of the first shield member and having a ring shape, the method comprising:

a first step of causing the driving means to locate the first shield member such that the first projecting portion and the second projecting portion engage with each other in a noncontact state;

a second step of, after the first step, sputtering the target while maintaining the first projecting portion and the second projecting portion at a position to engage with each other in the noncontact state; and a third step of, after the second step, causing the first opening/closing driving means to set the first shield member in the open state and sputtering the target to perform deposition on the substrate.

5. The electronic device manufacturing method according to claim 4, wherein the sputtering apparatus further includes:

a target shutter arranged near the target holder and configured to set one of a closed state in which the substrate holder is shielded from the target holder and an open state in which the substrate holder is opened to the target holder; and target shutter driving means for opening/closing-driving the target shutter to one of the open state and the closed state, and the second step further comprises a target cleaning step of causing the target shutter driving means to set the target shutter in the closed state and sputtering the target.

6. The electronic device manufacturing method according to claim 4, wherein the sputtering apparatus further includes:

a target shutter arranged near the target holder and configured to set one of a closed state in which the substrate holder is shielded from the target holder and an open state in which the substrate holder is opened to the target holder; and target shutter driving means for opening/closing-driving the target shutter to one of the open state and the closed state, and the second step further comprises a conditioning step of causing the target shutter driving means to set the target shutter in the open state and sputtering the target.

7. A sputtering method using a sputtering apparatus including:

a target holder provided in a vacuum container and configured to hold a target to be used for deposition on a substrate;

a substrate holder configured to hold the substrate;

a first shield member arranged near the substrate holder and configured to set one of a closed state in which the substrate holder is shielded from the target holder and an open state in which the substrate holder is opened to the target holder;

first opening/closing driving means for opening/closing-driving the first shield member to one of the open state and the closed state;

a second shield member having a ring shape and installed on a surface of the substrate holder at an outer peripheral portion of the substrate; and driving means for moving the substrate holder to move the substrate holder with the second shield member being installed close to or away from the first shield member in the closed state, the first shield member having at least one first projecting portion extending in a direction of the second shield member and having a ring shape, and the second shield member having at least one second projecting portion extending in a direction of the first shield member and having a ring shape, the method comprising:

a first step of causing the driving means to move the substrate holder close to the first shield member and locating the first projecting portion and the second projecting portion at a position to engage with each other in a noncontact state; and a second step of, after the first step, sputtering the target while maintaining the first projecting portion and the second projecting portion at the position to engage with each other in the noncontact state.

8. A sputtering method using a sputtering apparatus including:

a target holder provided in a vacuum container and configured to hold a target to be used for deposition on a substrate;

a substrate holder configured to hold the substrate;

a first shield member arranged near the substrate holder and configured to set one of a closed state in which the substrate holder is shielded from the target holder and an open state in which the substrate holder is opened to the target holder;

first opening/closing driving means for opening/closing-driving the first shield member to one of the open state and the closed state;

a second shield member having a ring shape and installed on a surface of the substrate holder at an outer peripheral portion of the substrate; and driving means for moving the first shield member to move the first shield member in the closed state close to or away from the substrate holder with the second shield member being installed, the first shield member having at least one first projecting portion extending in a direction of the second shield member and having a ring shape, and the second shield member having at least one second projecting portion extending in a direction of the first shield member and having a ring shape, the method comprising:

a first step of causing the driving means to locate the first shield member such that the first projecting portion and the second projecting portion engage with each other in a noncontact state; and a second step of, after the first step, sputtering the target while maintaining the first projecting portion and the second projecting portion at a position to engage with each other in the noncontact state.

* * * * *